(12) United States Patent
Kubo

(10) Patent No.: US 6,493,829 B1
(45) Date of Patent: Dec. 10, 2002

(54) SEMICONDUCTOR DEVICE ENABLE TO OUTPUT A COUNTER VALUE OF AN INTERNAL CLOCK GENERATION IN A TEST MODE

(75) Inventor: Takashi Kubo, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/400,911

(22) Filed: Sep. 22, 1999

(30) Foreign Application Priority Data

Apr. 22, 1999 (JP) .......................................... 11-114875

(51) Int. Cl.[7] .............................. G06F 1/04; G06F 1/14; H03L 7/06
(52) U.S. Cl. ...................... 713/500; 713/401; 713/502; 327/158
(58) Field of Search ................................ 713/400, 500, 713/401, 502; 327/158, 156, 99

(56) References Cited

U.S. PATENT DOCUMENTS

| | | | | |
|---|---|---|---|---|
| 5,355,037 A | * | 10/1994 | Andresen et al. | 327/158 |
| 5,473,754 A | * | 12/1995 | Folwell et al. | 714/45 |
| 5,604,775 A | * | 2/1997 | Saitoh et al. | 375/376 |
| 5,771,264 A | * | 6/1998 | Lane | 375/376 |
| 5,790,612 A | * | 8/1998 | Chengson et al. | 375/373 |
| 6,003,107 A | * | 12/1999 | Ranson et al. | 710/131 |
| 6,058,057 A | * | 5/2000 | Ochiai et al. | 365/201 |
| 6,118,730 A | * | 9/2000 | Kubo et al. | 365/233 |
| 6,157,690 A | * | 12/2000 | Koneda | 375/376 |
| 6,172,537 B1 | * | 1/2001 | Yanou et al. | 327/99 |
| 6,215,726 B1 | * | 4/2001 | Kubo | 365/233 |
| 6,259,288 B1 | * | 7/2001 | Nishimura | 327/156 |
| 6,292,016 B1 | * | 9/2001 | Jefferson et al. | 326/39 |
| 6,292,040 B1 | * | 9/2001 | Iwamoto et al. | 327/158 |
| 6,337,590 B1 | * | 1/2002 | Millar | 327/158 |

FOREIGN PATENT DOCUMENTS

| | | | |
|---|---|---|---|
| EP | 4214841 A | * | 11/1993 |
| JP | 6-60695 | | 3/1994 |
| JP | 7-131342 | | 5/1995 |
| JP | 410261289 A | * | 9/1998 |

* cited by examiner

Primary Examiner—Thomas Lee
Assistant Examiner—Chun Cao
(74) Attorney, Agent, or Firm—McDermott, Will & Emery

(57) ABSTRACT

In a SDRAM, a switch circuit is provided between a memory circuit and a data output circuit. The switch circuit provides data read out from the memory circuit to the data output circuit in a normal operation, and provides a count value of an up/down counter in a DLL circuit to the data output circuit when in a test operation. By monitoring output signals in the test operation, testing of whether the DLL circuit is proper or not can be carried out easily and correctly.

20 Claims, 29 Drawing Sheets

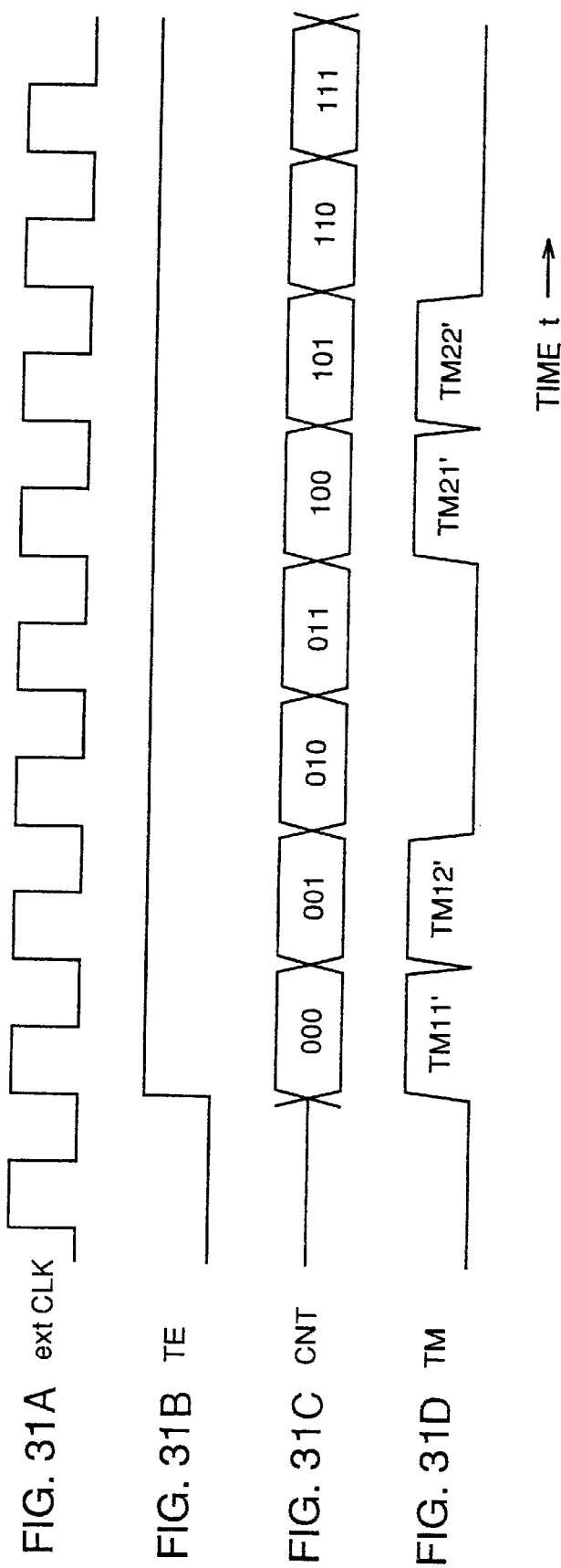

SEMICONDUCTOR DEVICE ENABLE TO OUTPUT A COUNTER VALUE OF AN INTERNAL CLOCK GENERATION IN A TEST MODE

BACKGROUND OF THE INVENTION

1. Field of the Invention

The present invention relates to semiconductor devices, and more particularly, to a semiconductor device operating in synchronization with an external clock signal.

2. Description of the Background Art

In accordance with the increase in the speed of the memory system, the standard for the input/output timing of signals has become extremely stringent in semiconductor memory devices such as a SDRAM.

In a SDRAM, an internal clock signal in synchronization with an external clock signal is generated by a DLL circuit. That internal clock signal is employed as the trigger signal of the output of data and a strobe signal thereof. The DLL circuit includes a variable delay circuit delaying an external clock signal to generate an internal clock signal, an I/O replica circuit delaying the internal clock signal by a delay time obtained taking into consideration the input path of the external clock signal and the data output path to generate a dummy clock signal, and a phase comparator comparing the phases between the external clock signal and the dummy clock signal to control the delay time of the variable delay circuit according to the comparison result. Accordingly, the output timing of the data and the strobe signal thereof can be set in complete synchronization with the external clock signal.

Although the DLL circuits plays an important role in a SDRAM, the operation state of a DLL circuit could be monitored only indirectly by the output data and the strobe signal.

However, the DLL circuit could not be tested properly since the effect of the circuit block other than the DLL circuit cannot be removed.

SUMMARY OF THE INVENTION

In view of the foregoing, a main object of the present invention is to provide a semiconductor device that can have testing of the internal clock generation operation carried out easily and correctly.

According to an aspect of the present invention, a semiconductor device includes a variable delay circuit generating an internal clock signal in synchronization with an external clock signal, a phase comparator comparing phases of an external clock signal and an internal clock signal to output first and second control signals to increase/decrease the delay time of the variable delay circuit, an up/down counter counting the number of times the first and second control signals are output, an internal circuit carrying out a predetermined operation in synchronization with an internal clock signal, and an output circuit providing the signal of the internal circuit outside when in a normal operation and providing the count value of the up/down counter outside when in a test mode. Therefore, the operation of internal clock generation can be tested easily and correctly by monitoring the output signal of the output circuit during testing.

Preferably, the delay time of the variable delay circuit is controlled by the count value of the up/down counter. In this case, the structure is simplified.

Also preferably, the semiconductor device further includes a shift register controlling the delay time of the variable delay circuit by the output signal of a plurality of registers. In this case, the delay time of the variable delay circuit can be controlled easily.

Also preferably, each of the plurality of registers at the first stage side of the plurality of shift registers retains a signal of the first logic. Each of the other registers retains a signal of the second logic. In this case, the delay time of the variable delay circuit is determined by the number of registers retaining the signal of the first logic.

Also preferably, one of the plurality of registers of the shift register retains a signal of the first logic. Each of the other registers retains a signal of the second logic. In this case, the delay time of the variable delay circuit is determined by the position of the register retaining the signal of the first logic.

Also preferably, the internal circuit is a memory circuit. The output circuit includes a switch circuit that passes data read out from the memory circuit in a normal operation mode and that passes the count value of the up/down counter when in a test mode, and a data output circuit providing outside the read out data and the count value passing through the switch circuit. In this case, the operation of the internal clock generation of the semiconductor memory device can be tested easily and correctly.

According to another aspect of the present invention, a semiconductor device includes a variable delay circuit generating an internal clock signal in synchronization with an external clock signal, a phase comparator comparing phases of an external clock signal and an internal clock signal to output first and second control signals to increase/decrease the delay time of the variable delay circuit, a shift register controlling the delay time of the variable delay circuit according to the output signal of a plurality of registers, an internal circuit carrying out a predetermined operation in synchronization with an internal clock signal, and an output circuit providing a signal of the internal circuit outside when in a normal operation mode, and providing the output signal of at least one register of each group outside when in a test mode. By monitoring the output signal of the output circuit in the test mode, the operation of the internal clock generation can be tested easily and correctly.

Preferably, the output circuit provides the output signals of the plurality of registers divided for output over a plurality of times in a time-divisional manner. In this case, the number of output signals per one time can be reduced. Therefore, the signals of all the registers can be output even when the number of signals that can be output at one time from the output circuit is smaller than the number of registers.

Also preferably, the output circuit provides the output signal of a preselected register of each group in a test mode. In this case, the signal of one register out of each group is output. Therefore, the number of output signals per one time can be reduced.

Also preferably, the output circuit provides the output signals of a plurality of preselected registers out of a plurality of groups divided for output over a plurality of times in a time-divisional manner. In this case, the number of output signals per one time can further be reduced.

Also preferably, the semiconductor device further includes a first logic circuit provided corresponding to each group to generate an OR, AND or exclusive-OR signal of the output signals of the plurality of registers belonging to a corresponding group. The output circuit provides the output signal of each first logic circuit in a test mode. In this case, the group corresponding to the head bit can easily be identified.

Also preferably, the output circuit provides the output signals of the plurality of logic circuits divided for output over a plurality of times in a time-divisional manner. In this case, the number of output signals per one time in the test mode can be reduced.

Also preferably, the plurality of registers of each group are further divided into a plurality of sub-groups. A determination circuit determines whether the logic of the output signal of the plurality of registers of each group matches or not, and selects the group does not match. The output circuit provides the output signal of at least one register of each sub-group belonging to the group selected by the determination circuit in a test mode. In this case, more detailed information can be obtained of the position of the head bit.

Also preferably, the test is divided into first and second tests. The output circuit provides the output signal of at least one register of each group in the first test mode, and provides the output signal of at least one register of each sub-group belonging to the group selected by the determination circuit in the second test mode. In this case, the number of output signals per one time can be reduced in the test mode.

Also preferably, the output circuit provides the output signals of the plurality of registers of each sub-group belonging to the selected group divided for output over a plurality of times. In this case, the number of output signals per one time can be further reduced.

Also preferably, the output circuit provides the output signal of a preselected register in each sub-group belonging to the selected group in a test mode. In this case, the number of output signals per one time in the test mode can be reduced.

Also preferably, the output circuit provides the output signals of a plurality of preselected registers out of a plurality of sub-groups divided for output over a plurality of times in a time-divisional manner. In this case, the number of output signals per one time can further be reduced.

Also preferably, each of the plurality of registers of the first stage side out of the plurality of registers of the shift register retains a signal of the first logic. Each of the other registers retains a signal of the second logic. In this case, the delay time of the variable delay circuit is determined by the number of registers retaining the signal of the first logic.

Also preferably, one register of the shift register retains the signal of the first logic. Each of the other registers retains the signal of the second logic. In this case, the delay time of the variable delay circuit is determined by the position of the register retaining the signal of first logic.

Further preferably, the internal circuit is a memory circuit. The output circuit includes a switch circuit that passes the data read out from the memory circuit in a normal operation mode, and passes the output signal of at least one register of each group in the test mode, and a data output circuit providing the read out data and the output signal of the register passing the switch circuit outside. In this case, the operation of the internal clock generation in the semiconductor memory device can be tested easily and correctly.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 31A–31D are timing charts to describe the operation of the signal generation circuit of FIG. 30.

DESCRIPTION OF THE PREFERRED EMBODIMENTS

First Embodiment

Figure 1:
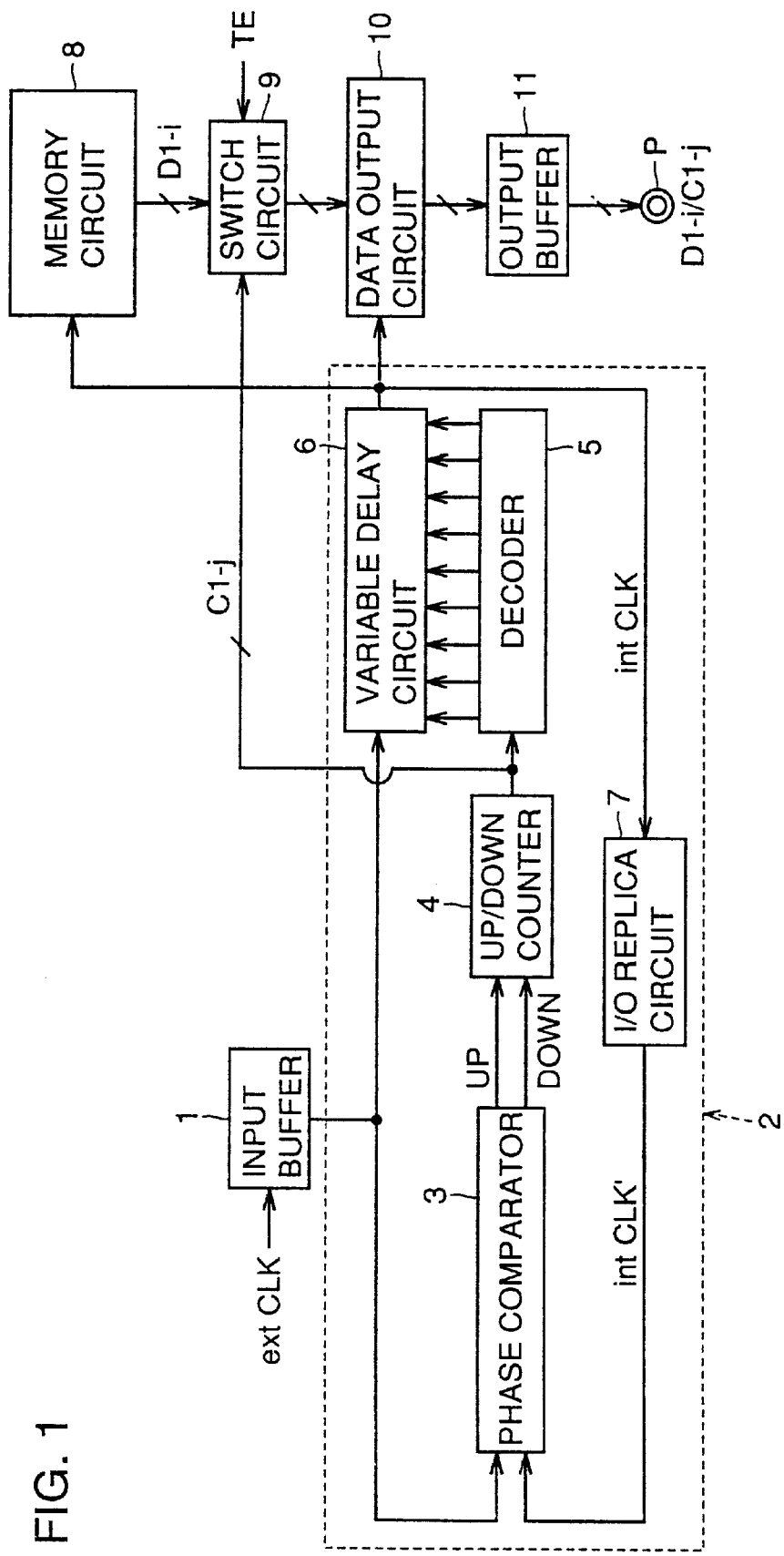
FIG. 1 is a block diagram showing the main part of a SDRAM according to a first embodiment of the present invention.

Referring to FIG. 1, a SDRAM according to a first embodiment of the present invention includes an input buffer 1, a DLL circuit 2, a memory circuit 8, a switch circuit 9, a data output circuit 10, an output buffer 11 and an external output pin group P. DLL circuit 2 includes a phase comparator 3, an up/down counter 4, a decoder 5, a variable delay circuit 6, and an I/O replica circuit 7.

Input buffer 1 transmits an externally applied clock signal extCLK to phase comparator 3 and variable delay circuit 6. Phase comparator 3 operates in synchronization with external clock signal extCLK to compare the phase of external clock signal extCLK from input buffer 1 with the phase of a dummy clock signal intCLK' from I/O replica circuit 7. When dummy clock signal intCLK' is behind external clock signal extCLK, a pulse signal UP to advance the phase of dummy clock signal intCLK' is output. When dummy clock signal intCLK' is ahead of external clock signal extCLK, a pulse signal DOWN to retard the phase of dummy clock signal intCLK' is output.

Up/down counter 4 counts the pulse of pulse signals UP and DOWN output from phase comparator 3 to provide count signals C1–Cj of j bits (where j is a natural number) to decoder 5 and switch circuit 9. Count signals C1–Cj of up/down counter 4 are incremented at every input of pulse signal UP and decremented at every input of pulse signal DOWN.

Figure 2:
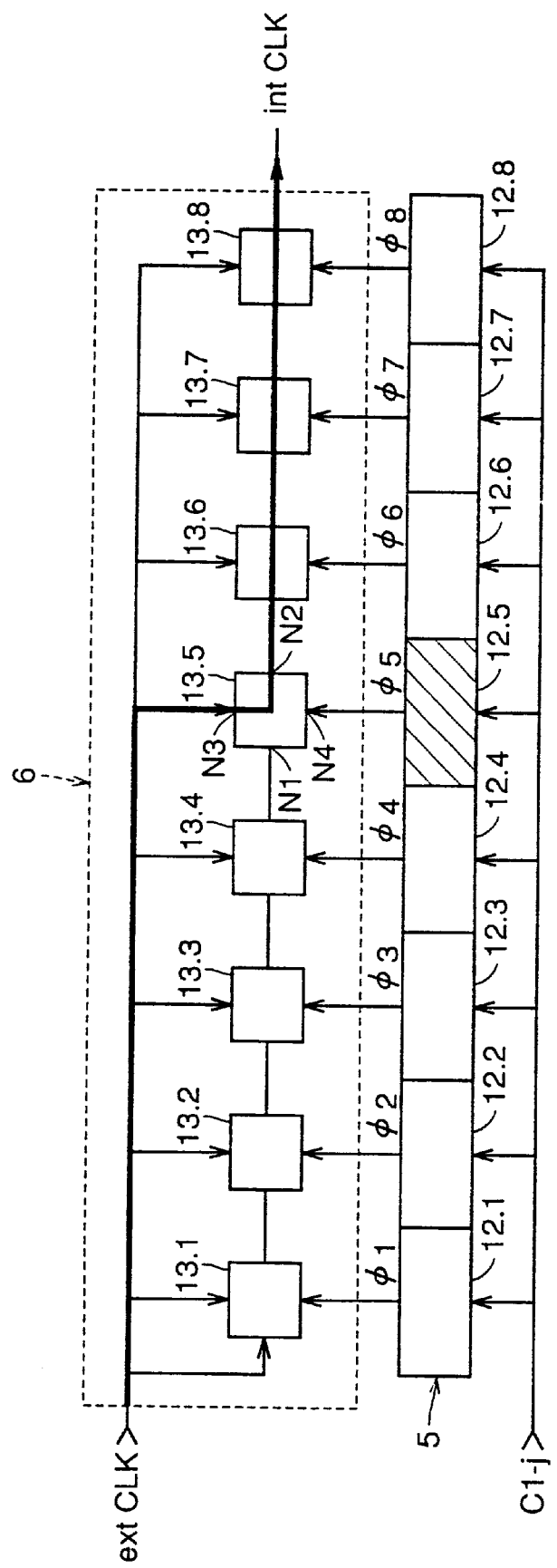
FIG. 2 is a block diagram showing a structure of a decoder and a variable delay circuit of FIG. 1.

Decoder 5 decodes output signals C1–Cj of up/down counter 4 to control the delay time of variable delay circuit 6. Decoder 5 includes a plurality (8 in the drawing) of decoder unit circuits 12.1–12.8, as shown in FIG. 2. Each of decoder unit circuits 12.1–12.8 is assigned a unique one of count signals C1–Cj. In response to the input of count signals C1–Cj from up/down counter 4, an output signal $\phi 5$ of a decoder unit circuit (for example decoder unit circuit 12.5) corresponding to count signals C1–Cj is driven to an active state of an H level (logical high). Output signals $\phi 1$–$\phi 4$, and $\phi 6$–$\phi 8$ of the other decoder unit circuits (in this case, decoder unit circuits 12.1–12.4, and 12.6–12.8) are driven to an inactive state of L level (logical low).

Variable delay circuit 6 delays external clock signal extCLK from input buffer 1 to generate an internal clock signal intCLK, which is applied to I/O replica circuit 7, memory circuit 8 and data output circuit 10. The delay time of variable delay circuit 6 is controlled by decoder 5.

Variable delay circuit 6 includes a plurality of delay unit circuits 13.1–13.8 connected in series as shown in FIG. 2. External clock signal extCLK is applied to each of delay unit circuits 13.1–13.8, whereby an internal clock signal intCLK is output from the last-stage delay unit circuit 13.8.

Figure 3:
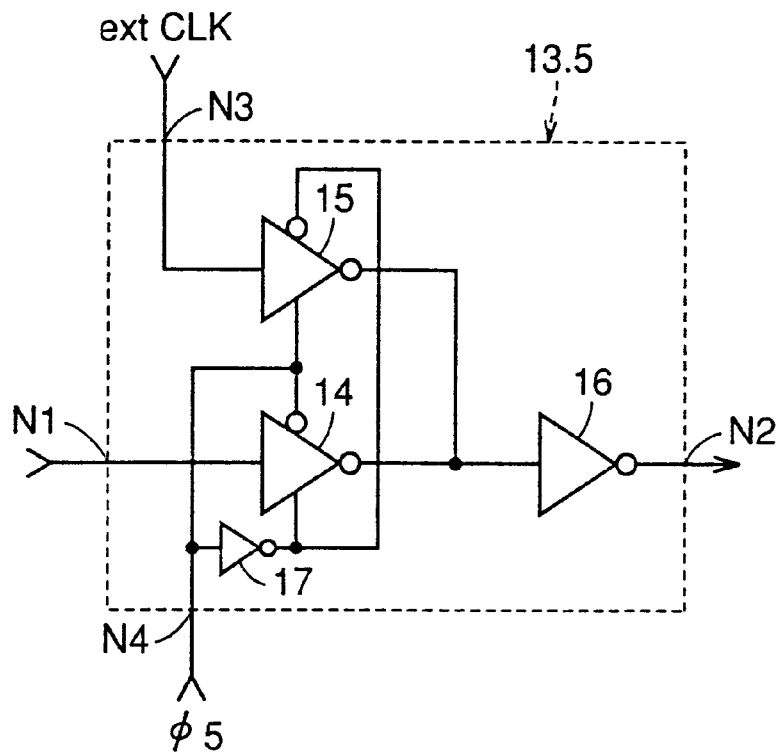
FIG. 3 is a circuit diagram showing a structure of a delay unit circuit of FIG. 2.

For example, delay unit circuit 13.5 includes an input node N1, an output node N2, an external clock input node N3, a control signal input node N4, clocked inverters 14 and 15, and inverters 16 and 17, as shown in FIG. 3. Input node N1 is connected to the output node of the preceding-stage delay unit circuit 13.4, and output node N2 is connected to the input node of succeeding-stage delay unit circuit 13.6. External clock signal extCLK is applied to external clock input node N3. Control signal $\phi 5$ from corresponding decoder unit circuit 12.5 is applied to control signal input terminal N4.

Clocked inverter 14 and inverter 16 are connected in series between input node N1 and output node N2. Clocked inverter 15 is connected between external clock input node N3 and the input node of inverter 16. Control signal input node N4 is connected to the inverting control node of clocked inverter 14 and to the control node of clocked inverter 15. Inverter 17 is connected between control signal input node N4 and the control node of clocked inverter 14, and the inverting control node of clocked inverter 15.

When control signal $\phi 5$ is at an active state of an H level, clocked inverter 15 is rendered active and clocked inverter 14 is rendered inactive. External clock signal extCLK applied via external clock input node N3 is delayed by inverters 15 and 16 and output to the next delay unit circuit 13.6. When control signal $\phi 5$ is at an inactive state of an L level, clocked inverter 14 is rendered active and clocked inverter 15 is rendered inactive. The clock signal from preceding delay unit circuit 13.4 is delayed by inverters 14 and 16 to be provided to the next delay unit circuit 13.6. Each of the other delay unit circuits 13.1–13.4 and 13.6–13.8 has a structure similar to that of delay unit circuit 13.5. It is to be noted that external clock signal extCLK is applied to the input node of the first delay unit circuit 13.1.

FIG. 2 shows the state where output signal $\phi 5$ of decoder unit circuit 12.5 is at an active state of an H level, whereby external clock signal extCLK is delayed by delay unit circuits 13.5–13.8 to become internal clock signal intCLK. When output signal $\phi 6$ of decoder unit circuit 12.6 attains an active state of an H level, external clock signal extCLK is delayed by delay unit circuits 13.6–13.8 to become internal clock signal intCLK, which is advanced in phase than that of FIG. 2. When output signal $\phi 4$ of decoder unit circuit 12.4 attains an active state of an H level, external clock signal extCLK is delayed by delay unit circuits 13.4–13.8 to become internal clock signal intCLK, which lags behind in phase than the state of FIG. 2.

Returning to FIG. 1 again, I/O replica circuit 7 has a delay time that is determined taking into account each delay time of input buffer 1, data output circuit 10 and output buffer 11 to delay internal clock signal intCLK from variable delay circuit 6, whereby a dummy clock signal intCLK' is generated and applied to phase comparator 3.

Memory circuit 8 includes a plurality of memory cells arranged in a matrix. Memory circuit 8 operates in synchronization with internal clock signal intCLK. Each memory cell is assigned a unique address. Application of a write address and write data causes data to be written into the memory cell corresponding to that address. Application of a read out address causes the data in the memory cell corresponding to that address to be read out. In memory circuit 8, i-bit (i is a natural number of at least j) data D1–Di can be written/read out simultaneously.

Switch circuit 9 provides output signals C1–Cj of up/down counter 4 to data output circuit 10 when a test signal TE is at an active state of an H level, and provides read out data D1–Di of memory cell circuit 8 to data output circuit 10 when test signal TE is at an inactive state of an L level.

Figure 4:
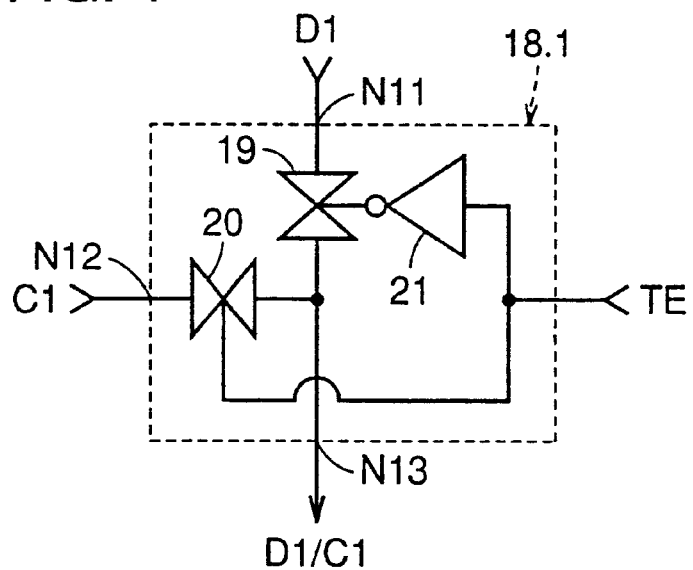
FIG. 4 is a circuit diagram showing a structure of a switch included in the switch circuit of FIG. 1.

Switch circuit 9 includes i switches 18.1–18.i provided corresponding to data D1–Di, respectively. Switch 18.1 includes a data input node N11, a count signal input node N12, an output node N13, transfer gates 19 and 20, and an inverter 21, as shown in FIG. 4. Transfer gate 19 is connected between data input node N11 and output node N13. Transfer gate 20 is connected between count signal input node N12 and output node N13. Test signal TE is applied directly to the control node of transfer gate 20, and also to the control node of transfer gate 19 via inverter 21. Corresponding data D1 is applied to data input node N11. Corresponding count signal C1 is applied to count signal input node N12. Output node N13 is connected to data output circuit 10.

In response to test signal TE attaining an active state of an H level, transfer gate 20 is rendered conductive and transfer gate 19 is rendered nonconductive. Count signal C1 of counter 4 is applied to data output circuit 10 via transfer gate 20. In response to test signal TE attaining an inactive state of an L level, transfer gate 19 is rendered conductive and transfer gate 20 is rendered nonconductive. Data D1 read out from memory circuit 8 is applied to data output circuit 10 via transfer gate 19. Each of other switches 18.2–18.i (not shown) has a similar structure, provided that a constant potential (for example, L level) is applied to count signal input node N12 of switches 18.j+1–18.i.

Data output circuit 10 temporarily holds read out data D1–Di of memory circuit 8 or count signals C1–Cj of up/down counter 4 applied via switch circuit 9, and then applies the same to output buffer 11 in synchronization with internal clock signal intCLK from variable delay circuit 6. Output buffer 11 provides data D1–Di or count signals C1–Cj from data output circuit 10 outside the chip via external output pin group P.

The operation of the SDRAM shown in FIGS. 1–4 will be described briefly hereinafter. External clock signal extCLK is applied to phase comparator 3 and variable delay circuit 6 via input buffer 1. External clock signal extCLK is delayed by variable delay circuit 6 to become internal clock signal intCLK. Internal clock signal intCLK is delayed by I/O replica circuit 7 to become dummy clock signal intCLK', which is applied to phase comparator 3.

The phases of external clock signal extCLK and dummy clock signal intCLK' are compared by phase comparator 3. When the phase of dummy clock signal intCLK' lags, pulse signal UP is applied to up/down counter 4. When the phase of dummy clock signal intCLK' leads, pulse signal DOWN is applied to up/down counter 4. Count signals C1–Cj of up/down counter 4 are decoded by decoder 5. The delay time of variable delay circuit 6 is controlled by decoder 5. When the phase of dummy clock signal intCLK' is leading, the delay time of variable delay circuit 6 is increased. When the phase of dummy clock signal intCLK' is lagging, the delay time of variable delay circuit 6 is shortened. Therefore, the phase of external clock signal extCLK matches the phase of dummy clock signal intCLK'.

In a normal operation, read out data D1–Di of memory circuit 8 are applied to data output circuit 10 via switch circuit 9. Data D1–Di are temporarily stored in data output circuit 10, and then output in synchronization with internal clock signal intCLK. Since the delay time of input buffer 1, data output circuit 10 and output buffer 11 are compensated for by I/O replica circuit 7, data D1–Di are output correctly in synchronization with external clock signal extCLK.

In a test operation, count signals C1–Cj of up/down counter 4 are applied to data output circuit 10 via switch circuit 9. Count signals C1–Cj are temporarily stored in data output circuit 10, and then output in synchronization with internal clock signal intCLK. By monitoring count signals C1–Cj, evaluation can be made whether DLL circuit 2 is properly operating from the initial state to the locking state. Also, evaluation of the swinging state after the locking state is achieved can be carried out easily and correctly, impervious unsusceptible to the effect of memory circuit 8.

Second Embodiment

Figure 5:
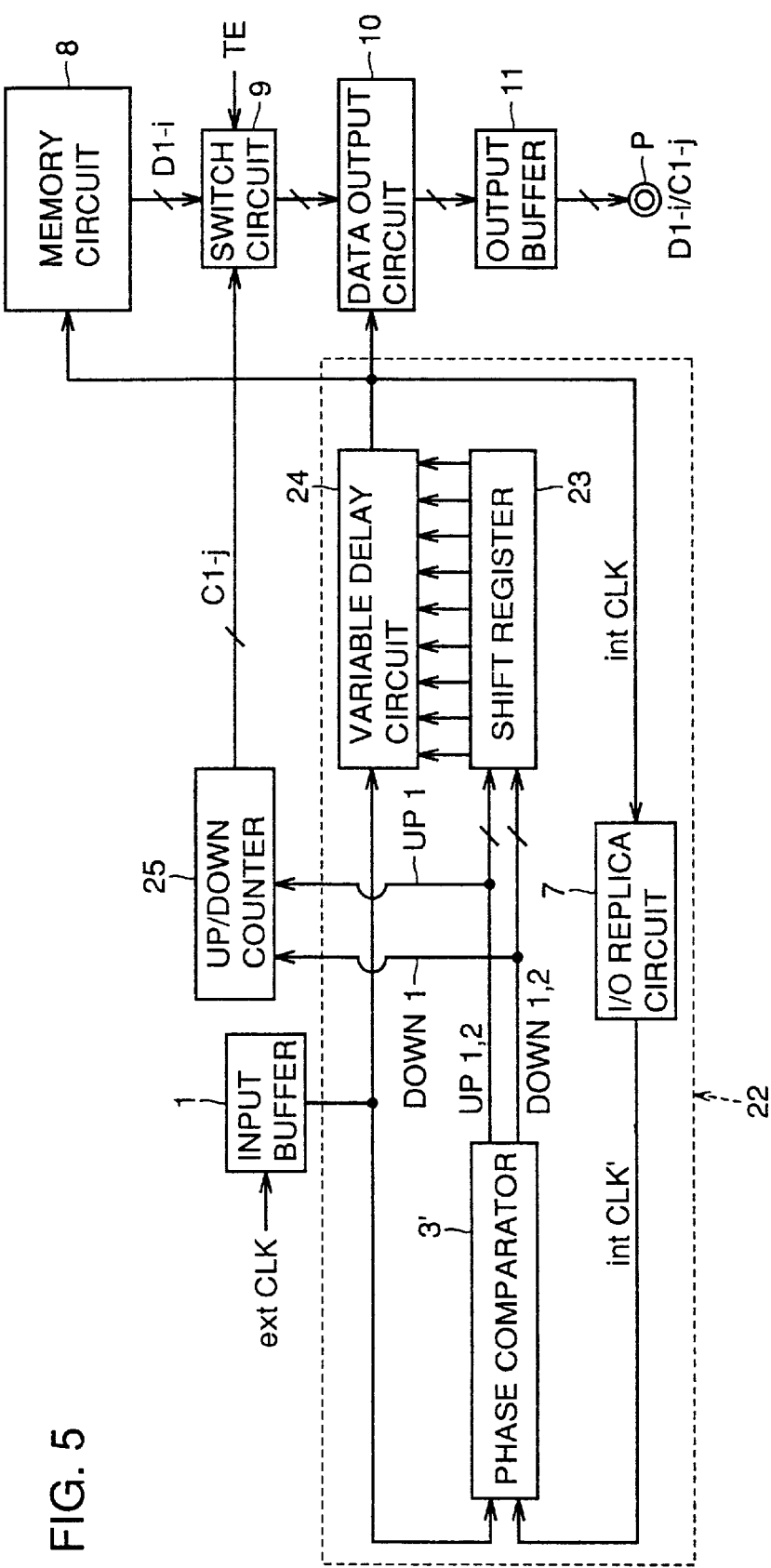
FIG. 5 is a block diagram showing the main part of a SDRAM according to a second embodiment of the present invention.
Figure 6:
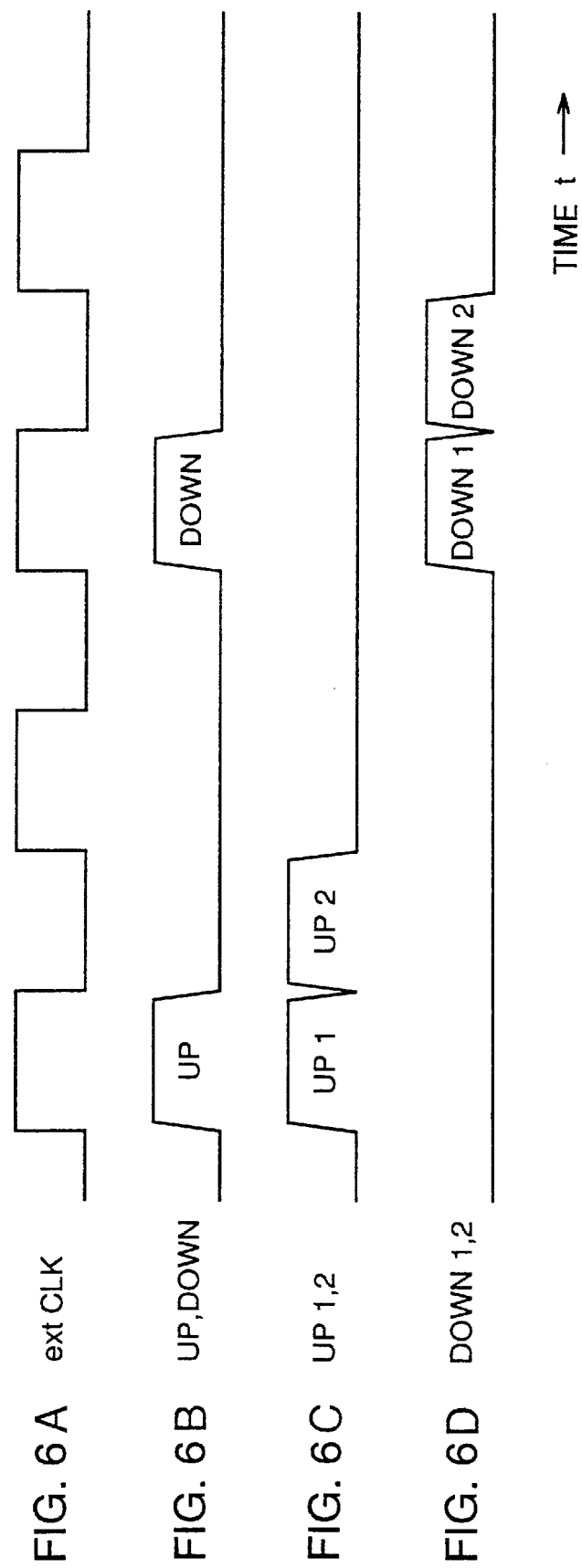
FIGS. 6A–6D are timing charts to describe the operation of the phase comparator of FIG. 5.

FIG. 5 is a block diagram showing the main part of a SDRAM according to a second embodiment of the present invention. The SDRAM of the second embodiment differs from the SDRAM of FIG. 1 in that DLL circuit 2 is replaced with a DLL circuit 22, and that an up/down counter 25 is newly provided.

DLL circuit 22 includes a phase comparator 3', a I/O replica circuit 7, a shift register 23, and a variable delay circuit 24. I/O replica circuit 7 is identical to that shown in FIG. 1. Phase comparator 3' having the function identical to that of phase comparator 3 of FIG. 1 provides signals UP1 and UP2 and signals DOWN 1 and DOWN 2 instead of signals UP and DOWN. Signals UP and DOWN are output for half a cycle of external clock signal extCLK in synchronization with the rising edge of internal clock signal intCLK, as shown in FIGS. 6A–6D. Signals UP 1 and DOWN 1 are output for half a cycle of external clock signal extCLK in synchronization with the rising edge of external clock signal extCLK. Signals UP 2 and DOWN 2 are output for only half a cycle of external clock signal extCLK following signals UP 1 and DOWN 1.

Figure 7:
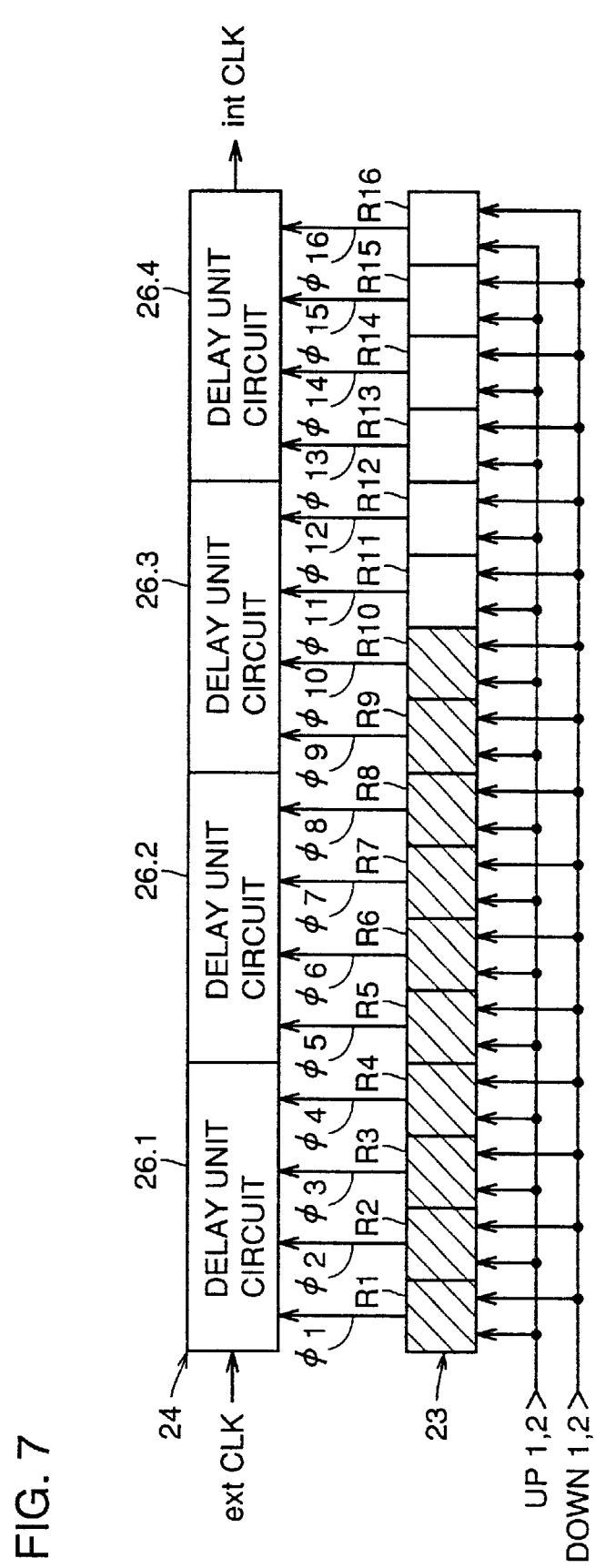
FIG. 7 is a block diagram showing a structure of a shift register and a variable delay circuit of FIG. 5.
Figure 8:
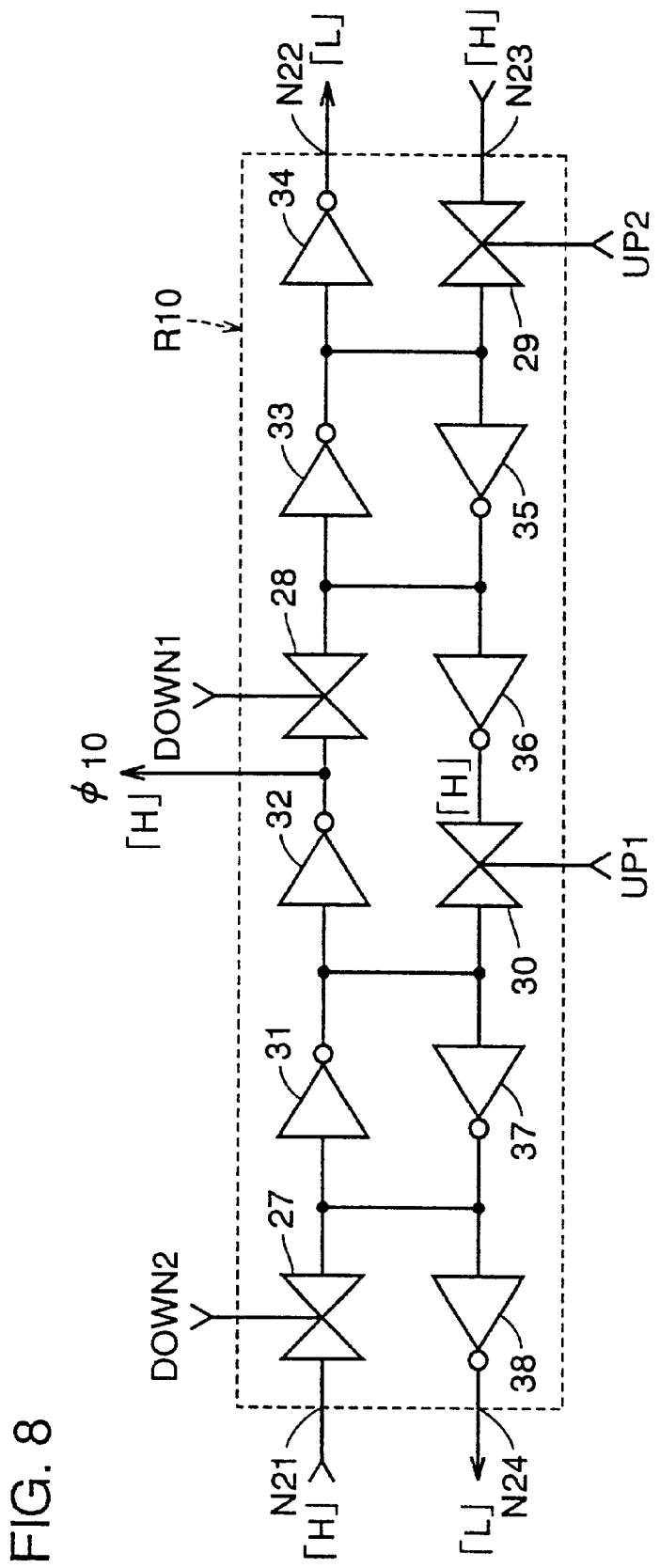
FIG. 8 is a circuit diagram showing a structure of a register of FIG. 7.

Shift register 23 includes a plurality (16 in the drawing) of registers R1–R16 connected in series as shown in FIG. 7. Register R10, for example, includes a first input node N21, a first output node N22, a second input node N23, a second output node N24, transfer gates 27–30, and inverters 31–38, as shown in FIG. 8. Transfer gate 27, inverters 31 and 32, transfer gate 28 and inverters 33 and 34 are connected in series between first input and output nodes N21 and N22. Transfer gate 29, inverters 35 and 36, transfer gate 30 and inverters 37 and 38 are connected in series between second input and output nodes N23 and N24. Inverters 31 and 37 and inverters 33 and 35 are connected in inverse-parallel respectively.

Signals DOWN 2, DOWN 1, UP 2 and UP 1 are applied to the control nodes of transfer gates 27–30, respectively. The output signal of inverter 32 corresponds to output signal φ10 of register R10. First input node N21 and second output node N24 are connected to the first output node and the second input node of the preceding register R9. Second input node N23 and first output node N22 are connected to the first input node and the second output node, respectively, of the next register R11.

Now, it is assumed that first and second input nodes N21 and N23 are at an H level, first and second output nodes N22 and N24 are at an L level, and inverters 32 and 36 provide outputs of an H level. In response to signals UP 1 and UP 2 attaining the active state of an H level, transfer gates 30 and 29 conduct. The output of each of inverters 31, 32, 37 and 38 is inverted. Signal φ10 attains an L level. In response to signals DOWN 1 and DOWN 2 attaining an active state of an H level, transfer gates 28 and 27 conduct. The output of each of inverters 33–39 is inverted. First output node N22 attains an H level. Each of the other registers R1–R9 and R11–R16 has a similar structure.

Variable delay circuit 24 includes delay unit circuits 26.1–26.4 connected in series. Delay unit circuits 26.1–26.4 receive output signals φ1–φ4, φ5–φ8, φ9–φ12 and φ13–φ16 of registers R1–R4, R5–R8, R9–R12 and R13–R16, respectively.

Figure 9:
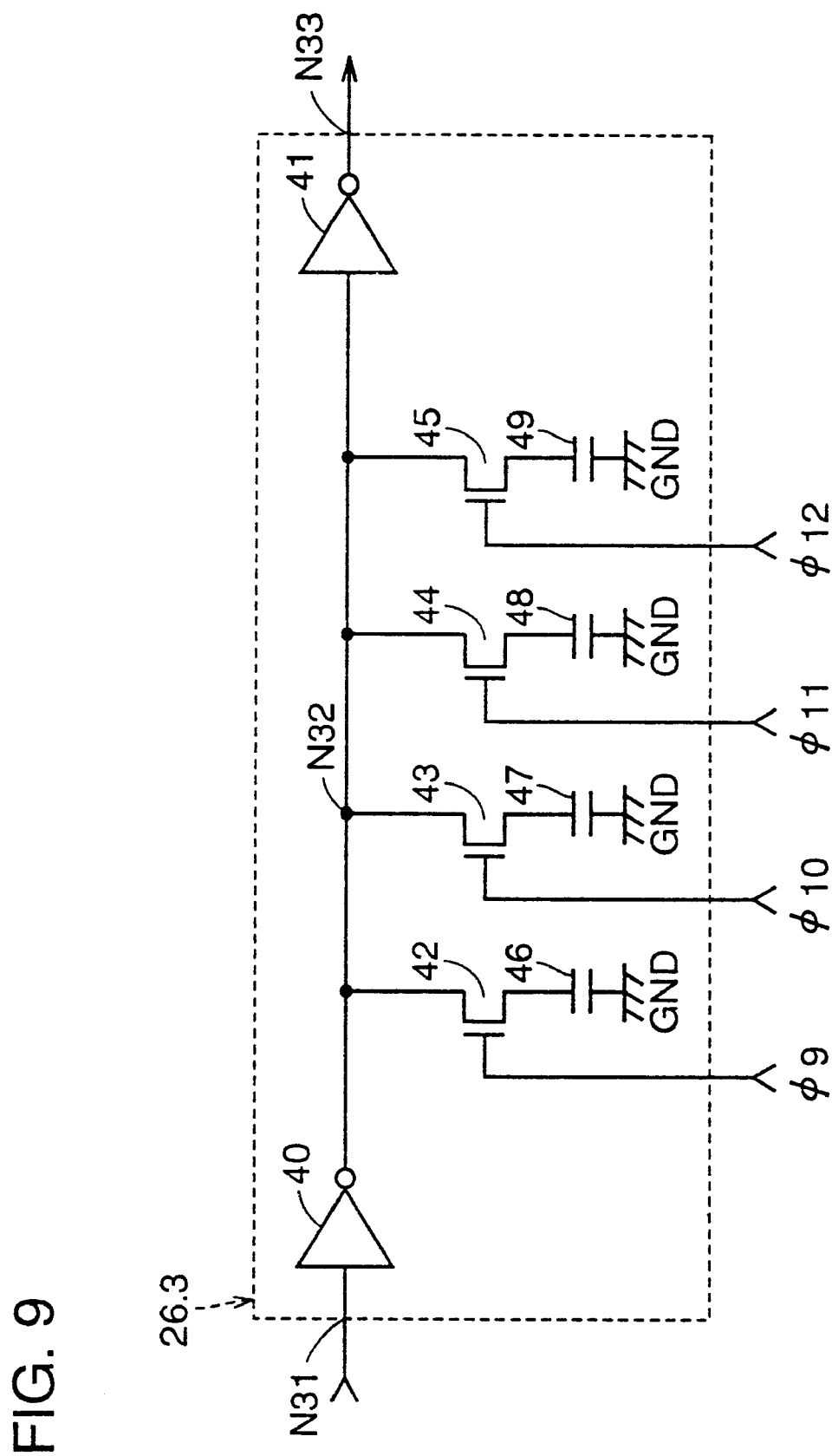
FIG. 9 is a circuit diagram showing a structure of a delay unit circuit of FIG. 7.

Delay unit circuit 26.3 includes inverters 40 and 41, N channel MOS transistors 42–45 and capacitors 46–49, as shown in FIG. 9. Inverter 40 and 41 are connected in series between input node N31 and output node N33. N channel MOS transistor 42 and capacitor 46, N channel MOS transistor 43 and capacitor 47, N channel MOS transistor 44 and capacitor 48, and N channel MOS transistor 45 and capacitor 49 are respectively connected in parallel between output node N32 of inverter 40 and the line of ground potential GND. Output signals φ9–φ12 of registers R9–R12 are applied to the gates of N channel MOS transistors 42–45.

Now, it is assumed that signals φ9 and φ10 are at an active state of an H level, and signals φ11 and φ12 are at an inactive state of an L level. In this case, only N channel MOS transistors 42 and 43 out of N channel MOS transistors 42–45 conduct. Only two capacitors 46 and 47 out of capacitors 46–49 are connected to output node N32 of inverter 40. In response to signal φ11 attaining an H level, N channel MOS transistor 44 conducts. Capacitor 48 is connected to node N32. The load capacitance of inverter 40 becomes greater, whereby the delay time of delay circuit 26.3 is increased. In contrast, when signal φ10 attains an L level, N channel MOS transistor 43 is rendered nonconductive, whereby capacitor 42 is disconnected from node N32. The load capacitance of inverter 40 becomes smaller, whereby the delay time of delay unit circuit 26.3 becomes shorter. Each of the other delay unit circuits 26.1, 26.2, and 26.4 has a similar structure.

FIG. 7 shows the state where output signals φ1–φ10 of registers R1–R10 are at an active state of an H level, and output signals φ11–φ16 of registers R11–R16 are at an inactive state of an L level. As discussed previously, two capacitors 46 and 47 in delay unit circuit 26.3 are connected to node N32, so that the delay time corresponds to an intermediate time. In delay unit circuits 26.1 and 26.2, four capacitors 46–49 are not connected to node N32, so that the longest delay time is set. In delay unit circuit 26.4, four capacitors 46–49 are not connected to node N32, so that the shortest delay time is set. When the output signal of register R11 is at an active state of an H level, the delay time of variable delay circuit 24 is increased. The phase of internal clock signal intCLK lags behind that of FIG. 7. When the output signal of register R10 attains an inactive state of an L level, the delay time of variable delay circuit 24 becomes shorter. The phase of internal clock signal intCLK leads that of FIG. 7. Therefore, DLL circuit 22 operates in a manner similar to that of DLL circuit 2 of FIG. 1.

Returning to FIG. 5, up/down counter 25 counts the number of pulses of pulse signals UP 1 and DOWN 1 output from phase comparator 3'. Count signals C1–Cj of j bits are applied to switch circuit 9. Count signals C1–Cj of up/down counter 25 are incremented at every input of pulse signal UP 1, and decremented at every input of pulse signal DOWN 1. The remaining structure and operation are similar to those described with reference to the SDRAM of the first embodiment. Therefore, description thereof will not be repeated.

By monitoring count signals C1–Cj of up/down counter 25 as in the first embodiment, evaluation can be made whether DLL circuit 22 operates properly from the initial state to the locking state. Also, the swinging state subsequent to the achievement of the locking state can be evaluated easily and correctly, impervious to memory circuit 8.

Third Embodiment

Figure 10:
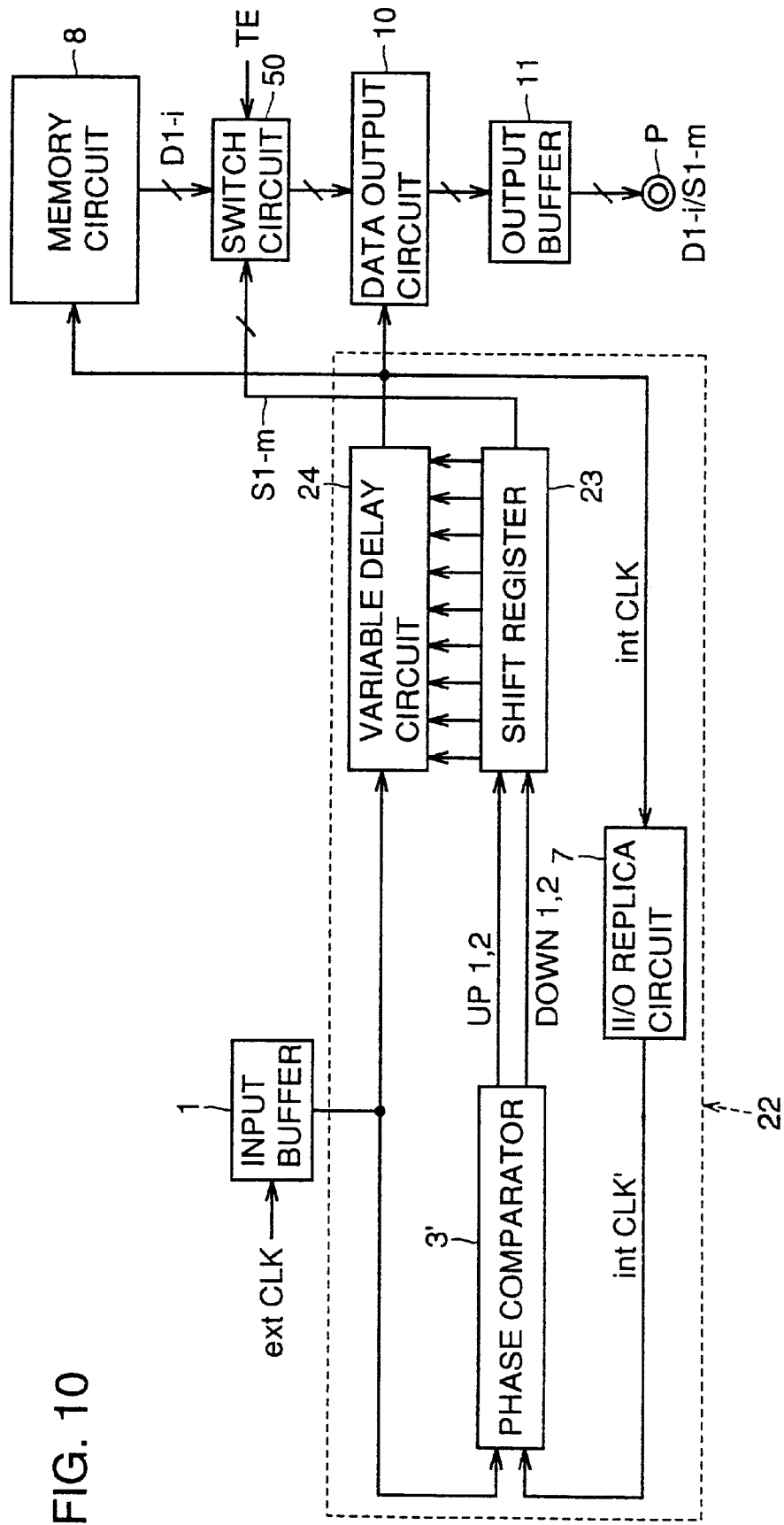
FIG. 10 is a block diagram showing the main part of a SDRAM according to a third embodiment of the present invention.

FIG. 10 is a block diagram showing the main part of a SDRAM according to a third embodiment of the present invention. The SDRAM of the third embodiment differs from the SDRAM of FIG. 5 in that up/down counter 25 is removed, switch circuit 9 is replaced with a switch circuit 50, and output signals S1–Sm (where m is a natural equal to or less than i) of shift register 23 are applied to switch circuit 50.

Figure 11:
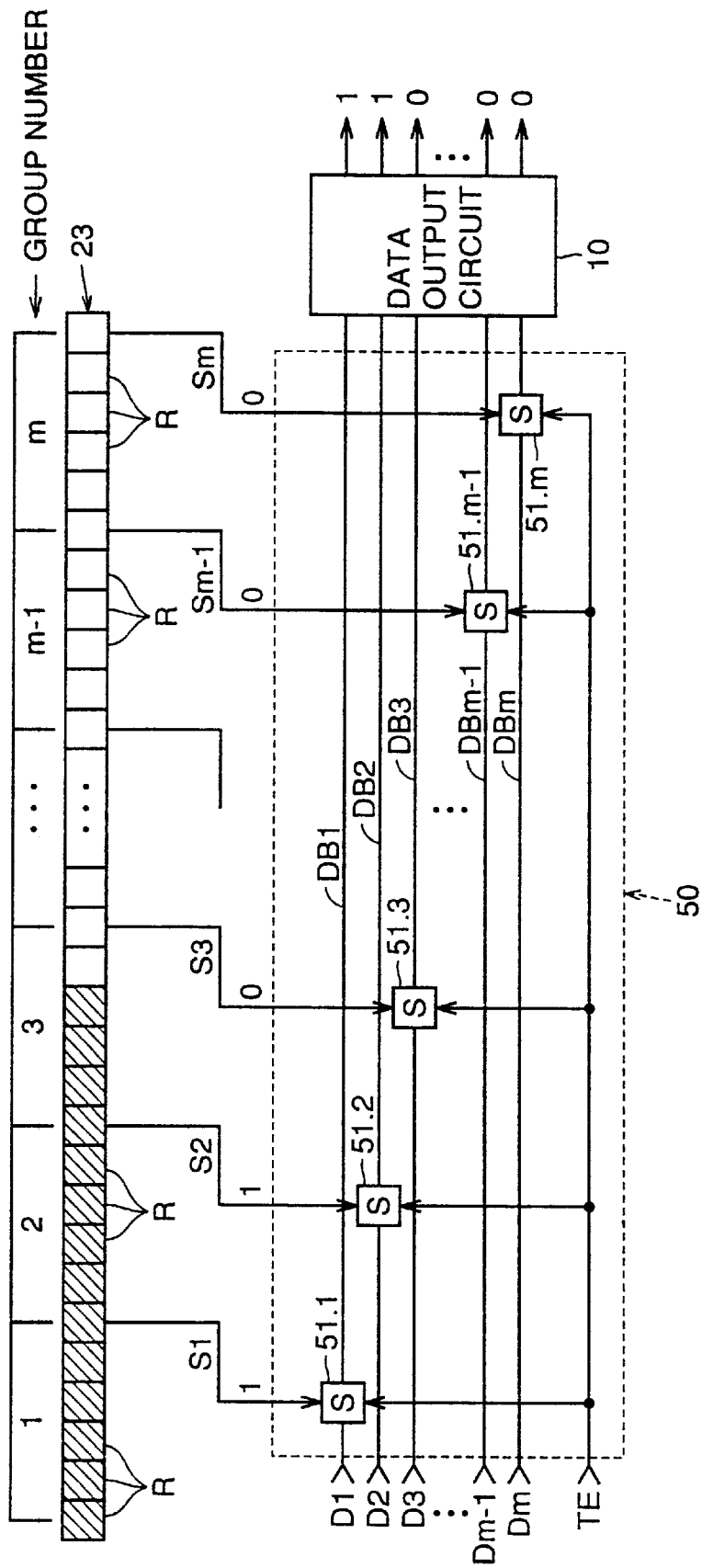
FIG. 11 is a schematic view of a structure of a shift register and a switch circuit of FIG. 10.

As shown in FIG. 11, the SDRAM has the register R group of shift register 23 divided into m groups. Output signals S1–Sm of respective registers R of a predetermined stage (for example, the last stage in each group in the drawing) of each of the m groups are applied to switch circuit 50.

Figure 12:
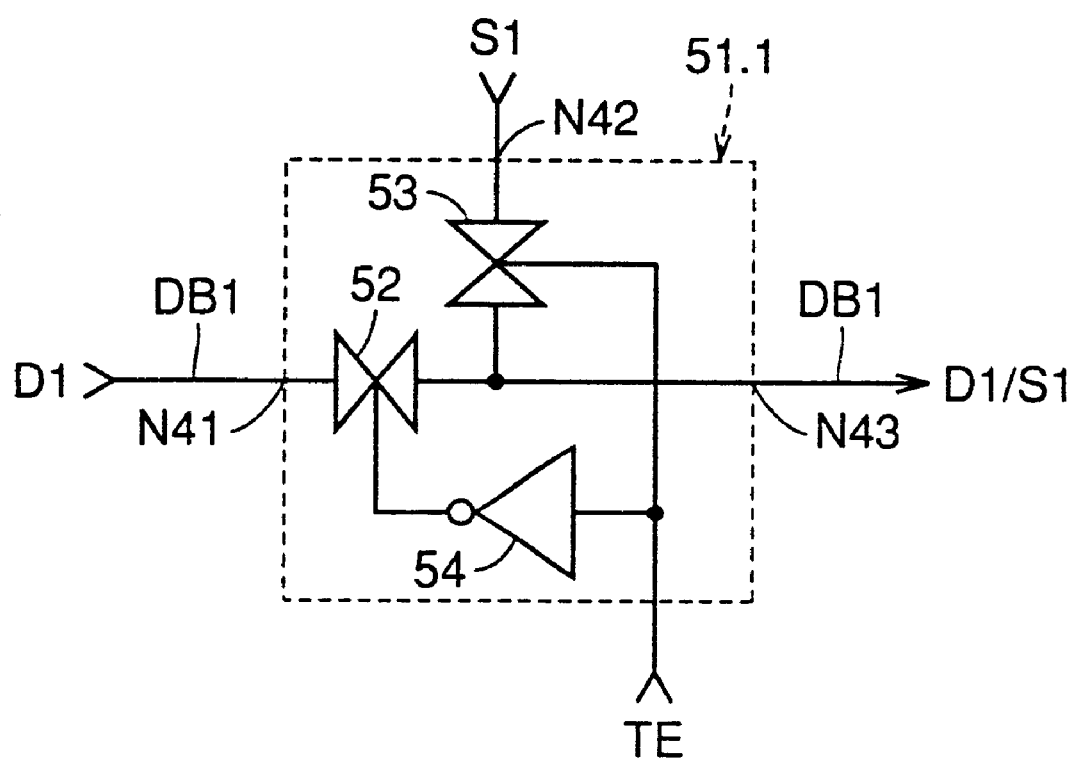
FIG. 12 is a circuit diagram showing a structure of a switch of FIG. 11.

As shown in FIG. 11, switch circuit 50 includes switches 51.1–51.m interposed in data buses DB1–DBm, respectively. Data buses DB1–DBm are provided to transmit data D1–Dm read out from memory circuit 8 to data output circuit 10. As shown in FIG. 12, switch 51.1 includes a data input node N41, a control signal input node N42, an output node N43, transfer gates 52 and 53, and an inverter 54. Transfer gate 52 is connected between data input node N41 and output node N43. Transfer gate 53 is connected between control signal input node N42 and output node N43. Test signal TE is directly applied to the control node of transfer gate 53, and also to the control node of transfer gate 52 via inverter 54. Data D1 is applied to data input node N41. Control signal S1 is applied to control signal input node N42.

In response to test signal TE attaining an active state of an H level, transfer gate 53 is rendered conductive whereas transfer gate 52 is rendered nonconductive. Control signal S1 is transmitted to output node N43. In response to test signal TE attaining an inactive state of an L level, transfer gate 52 is rendered conductive whereas transfer gate 53 is rendered nonconductive. Data D1 is transmitted to output node N43. Each of switches 51.2–51.m has a similar structure.

In other words, switch circuit 50 provides to data output circuit 10 signals S1–Sm output from shift register 23 when test signal TE is at an H level, and data D1–Di read out from memory circuit 8 when test signal TE is at an L level. The remaining structure and operation are similar to those of the second embodiment. Therefore, description thereof will not be repeated.

In the present embodiment, identification can easily be made of whether register R of a predetermined position in each group outputs data 1 or 0. An advantage similar to that of the second embodiment can be provided.

In the present embodiment, only the output signal of one register R of each group is output outside. However, the output signals of all registers R can be divided for output over a plurality of times in a time-divisional manner.

Figure 14:
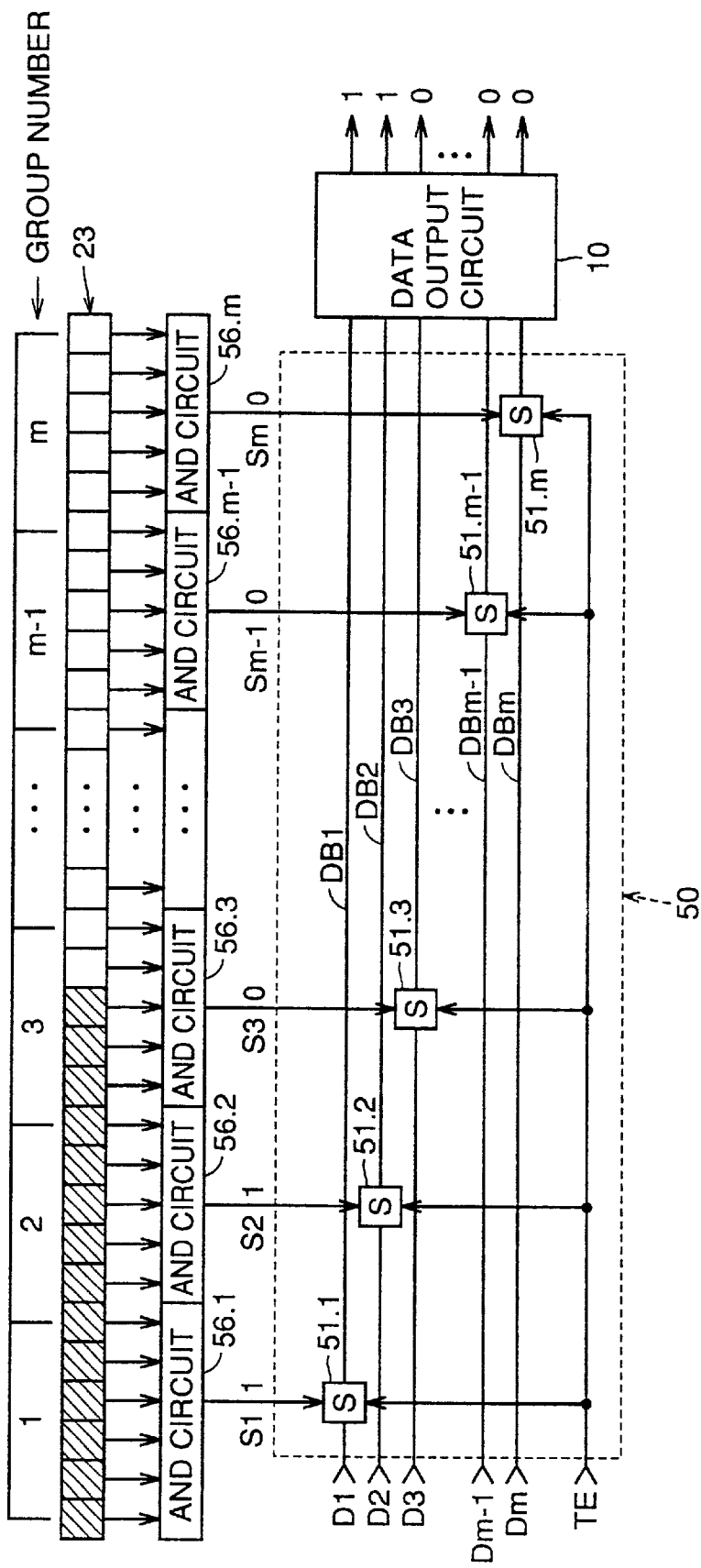
Figure 15:
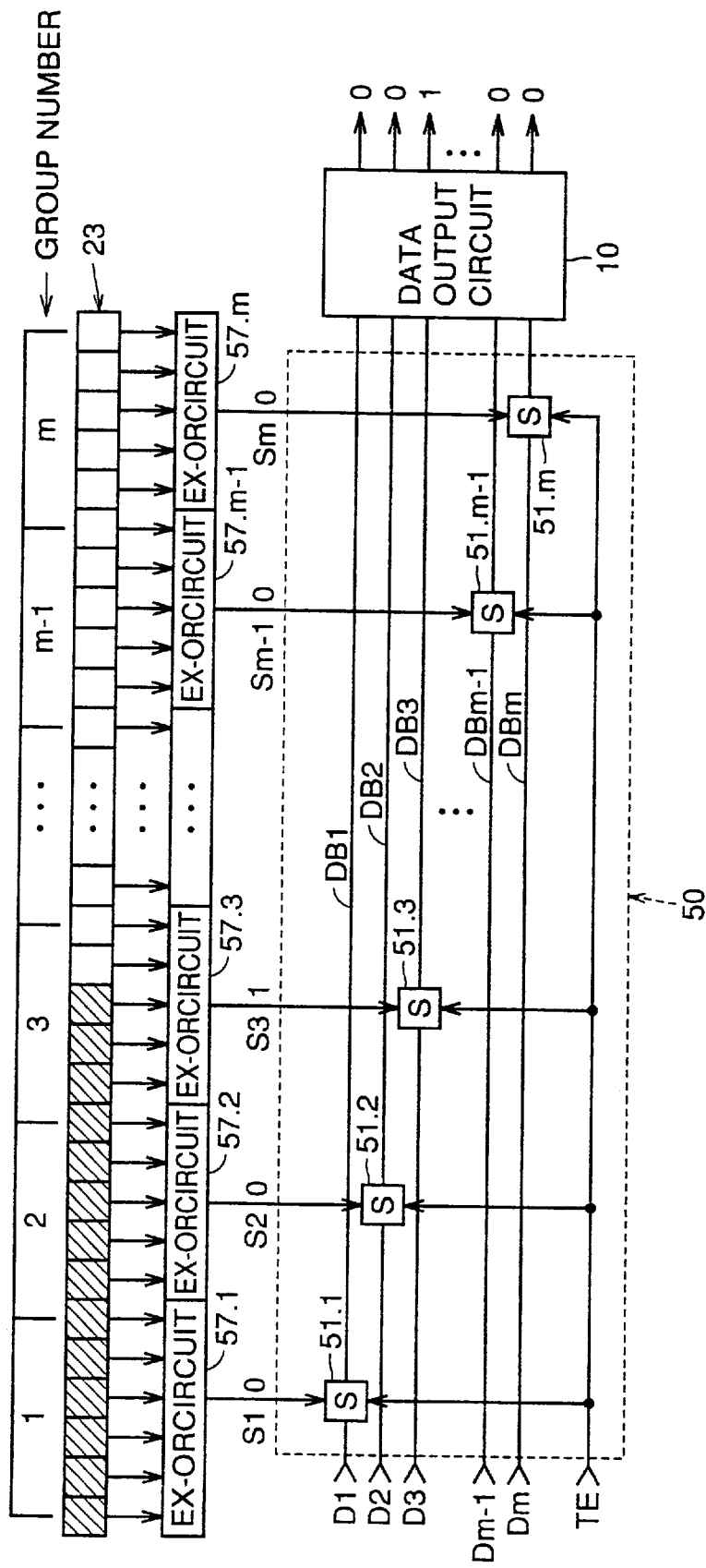

A modification of the third embodiment will be described hereinafter. In the modification shown in FIG. 13, OR circuits 55.1–55.m are provided between them groups of registers and switches 51.1–51.m. OR circuit 55.1 generates an OR signal S1 of the output signal of register R of the first group. Signal S1 is applied to switch 51.1. The other OR circuits 55.2–55.m are similar to OR circuit 55.1. In this modification, identification can be made whether there is a register R that provides data 1 (hatched area in drawing) in each group. A similar advantage can be achieved when AND circuits 56.1–56.m are provided instead of OR circuits 55.1–55.m, as shown in FIG. 14. Furthermore, a similar advantage can be achieved when EX-OR circuits 57.1–57.m are provided instead of OR circuits 55.1–55.m, as shown in FIG. 15.

Figure 13:
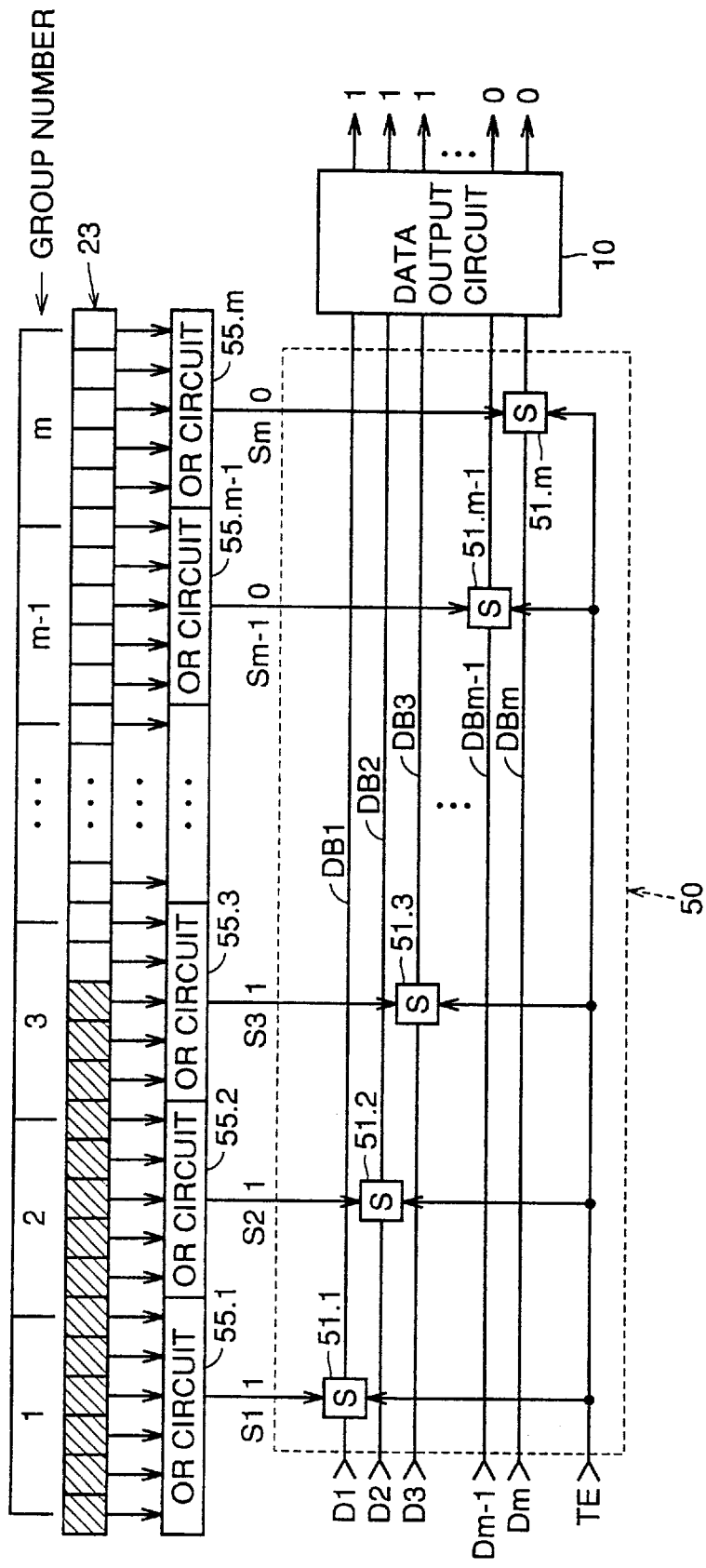
FIGS. 13, 14, 15 and 16 are block diagrams showing modifications of the third embodiment of the present invention.
Figure 16:
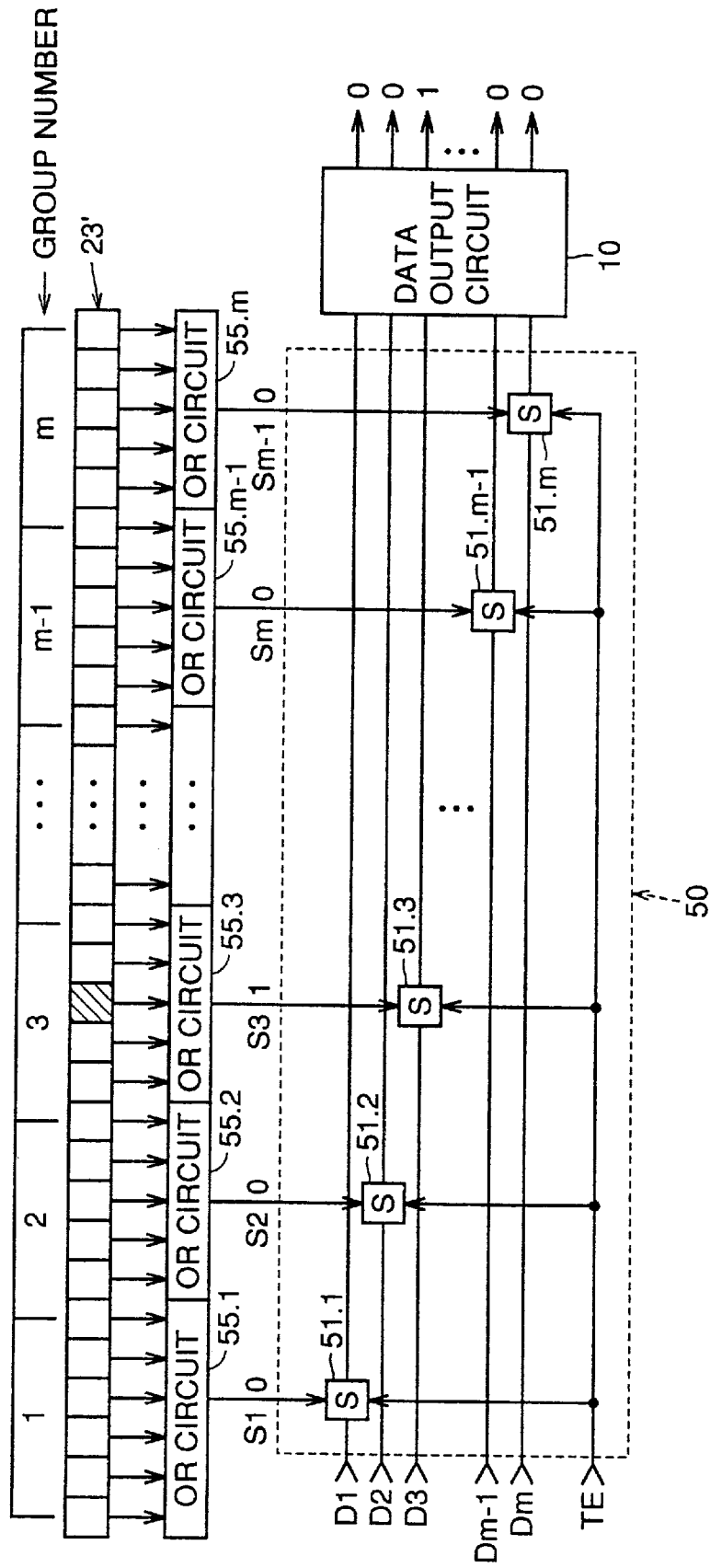

FIG. 16 is a block diagram showing another modification, corresponding to that of FIG. 13. The modification of FIG. 16 differs from the modification of FIG. 13 in that shift register 23 is replaced with a shift register 23'. In shift register 23', only one register R out of all registers R outputs data 1. The register providing data 1 is shifted in response to signals UP 1, UP 2, DOWN 1 and DOWN 2. According to this modification, identification can be made whether there is a register R that outputs data 1 (hatched area in drawing) in each group. It is to be noted that variable delay circuit 6 of the type of the first embodiment is employed.

Fourth Embodiment

Figure 17:
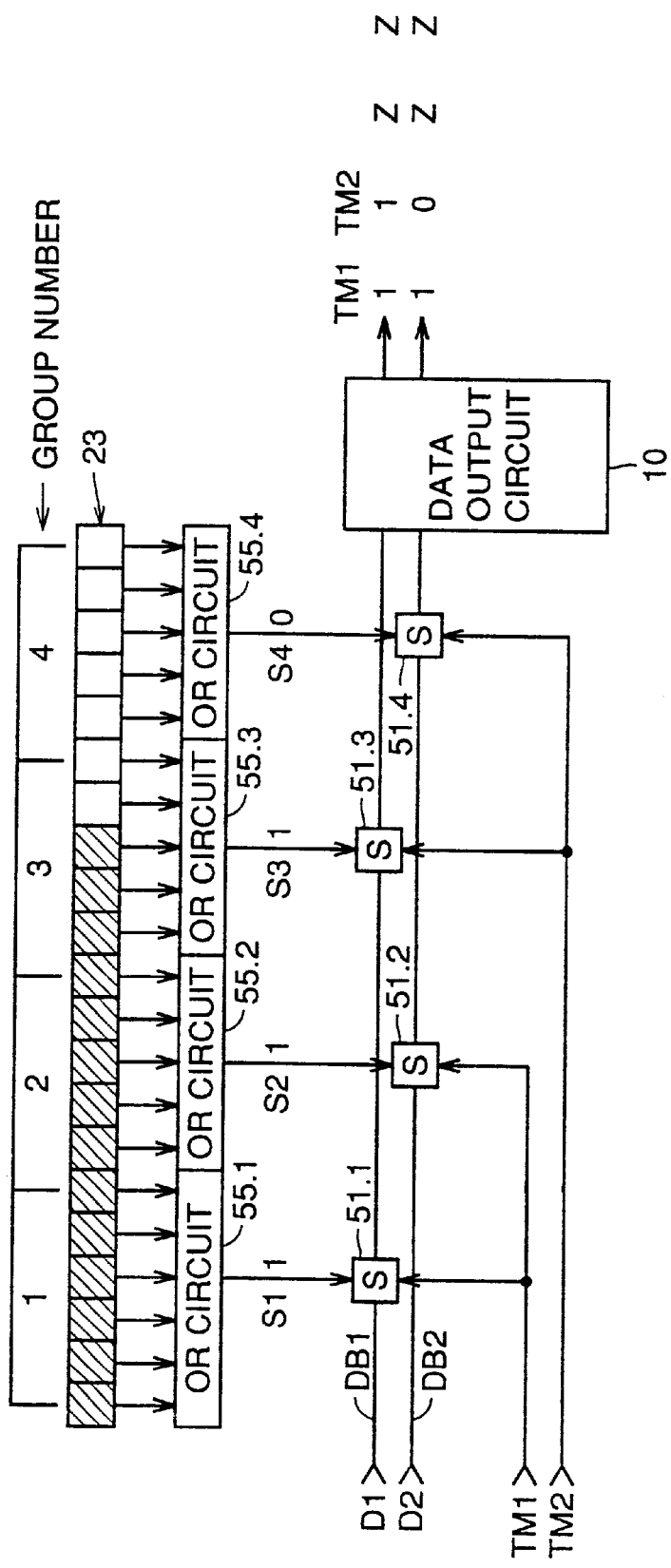
FIG. 17 is a block diagram showing the main part of a SDRAM according to a fourth embodiment of the present invention.

FIG. 17 is a block diagram showing the main part of a SDRAM according to a fourth embodiment of the present invention, comparable to that of FIG. 13. For the sake of simplification, m=4 is set in FIG. 17. Switches 51.3 and 51.4 are interposed in data buses DB1 and DB2, respectively. Switches 51.1 and 51.2 are controlled by a signal TM1. Switches 51.3 and 51.4 are controlled by a signal TM2.

Figure 18:
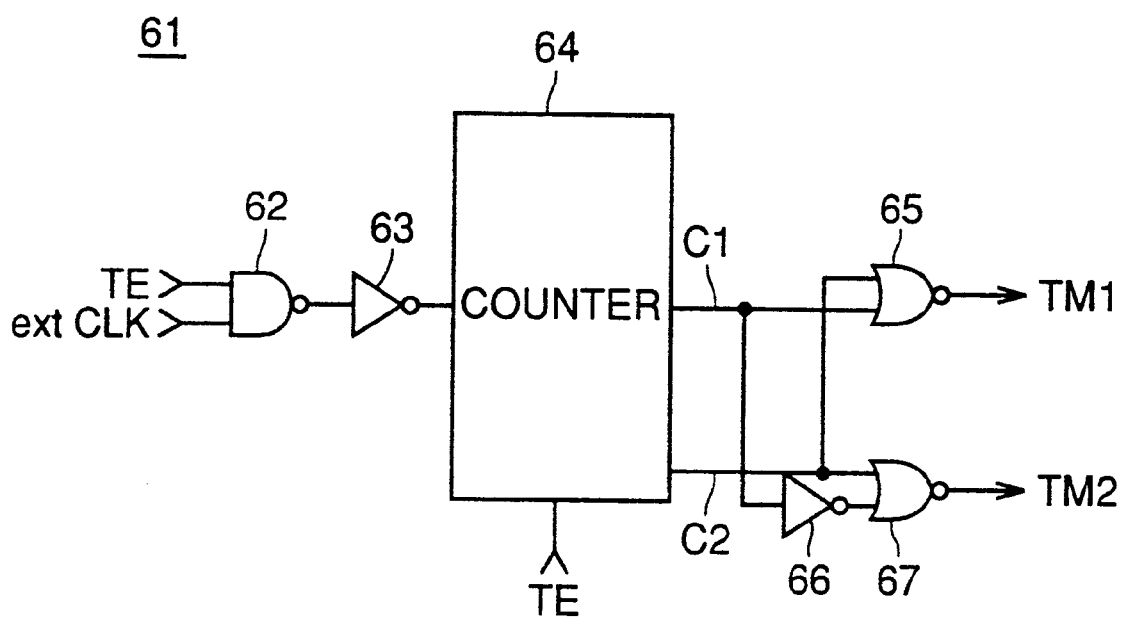
FIG. 18 is a circuit block diagram showing a structure of a signal generation circuit to generate signals TM1 and TM2 of FIG. 17.

FIG. 18 is a circuit block diagram showing a structure of a signal generation circuit 61 to generate signals TM1 and TM2. Signal generation circuit 61 includes a NAND gate 62, inverters 63 and 66, a 2-bit counter 64, and NOR gates 65 and 67. NAND gate 62 receives test signal TE and external clock signal extCLK. The output of NAND gate 62 is applied to counter 64 via inverter 63.

Counter 64 is rendered active when test signal TE attains an active state of an H level to count the number of pulses of the clock signal output from inverter 63, and provides count signals C1 and C2 of 2 bits. Counter 64 is reset when test signal TE is at an inactive state of an L level, and output signals C1 and C2 are fixed to 1 and 1. Signal C1 is directly applied to one input node of NOR gate 65, and also applied to one input node of NOR gate 67 via inverter 66. Signal C2 is applied to the other input nodes of NOR gates 65 and 67. The outputs of NOR gates 65 and 67 are signals TM1 and TM2, respectively. Signal TM1 attains an H level when signals C1 and C2 are 0 and 0, and attains an L level when signals C1 and C2 are 1 and 0, 0 and 1, or 1 and 1. Signal TM2 attains an H level when signals C1 and C2 are 1 and 0, and attains an L level when signals C1 and C2 are 0 and 0, 0 and 1 or 1 and 1.

The operation of the SDRAM of FIGS. 17 and 18 will now be described. When test signal TE is at an inactive state of an L level, control signals S1–S4 are blocked by switches 51.1–51.4. Data D1 and D2 are applied to data output circuit 10 via data buses DB1 and DB2.

When test signal TE is at an active state of an H level, signal TM1 attains an H level during the period of count signals C1, C2 of counter 64 being 0, 0 out of the four clock cycle periods where count signals C1 and C2 of counter 64 are 0, 0; 1, 0; 0, 1; and 1, 1. Signal TM2 attains an H level during the period of count signals C1 and C2 being 1 and 0 of counter 64. During the period of signal TM1 at an H level, control signals S1 and S2 pass through switches 51.1–51.4 to be applied to data output circuit 10. During the period of signal TM2 at an H level, control signals S3 and S4 pass through switches 51.3 and 51.4 to be applied to data output circuit 10. Data output circuit 10 outputs control signal S1, S2; S3, S4 outside via output buffer 11 and external output pin group P in synchronization with internal clock signal intCLK.

In addition to the advantage of the third embodiment, the present embodiment is advantageous in that the number of data buses and the number of input terminals of the monitor device used during testing can be reduced.

In the present embodiment, the output signals of OR circuits 55.1–55.4 are divided for output over 2 times in a time-divisional manner. Alternatively, the output signals can be divided for output over 4 times in the time-divisional manner.

Fifth Embodiment

Figure 19:
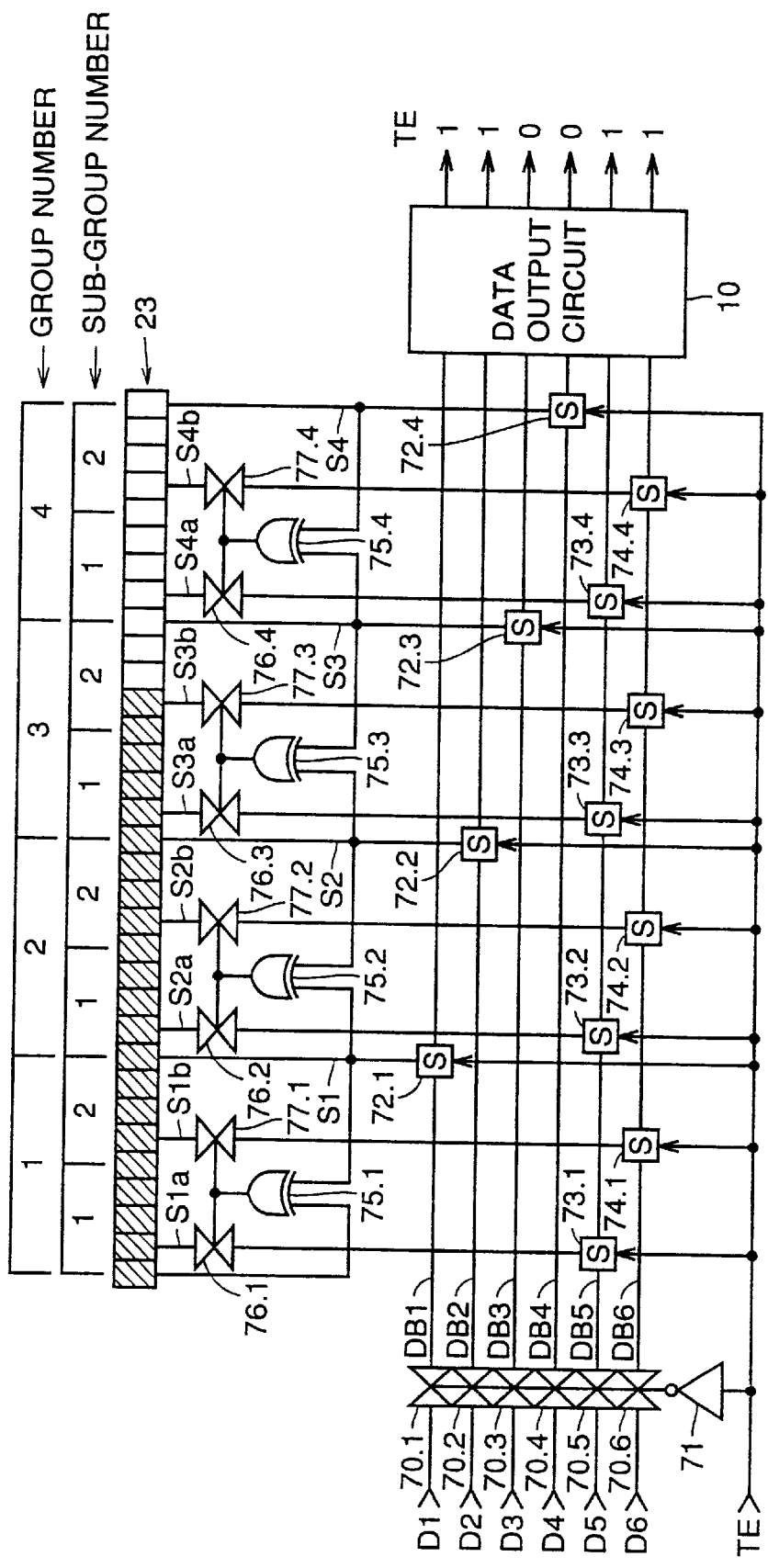
FIG. 19 is a circuit block diagram showing the main part of a SDRAM according to a fifth embodiment of the present invention.

FIG. 19 shows the main part of a SDRAM according to a fifth embodiment of the present invention, comparable to that of FIG. 11. In the SDRAM of FIG. 19, register R group of the shift register is divided into a plurality of groups (4 in the drawing). Each group is further divided into a plurality of sub-groups (2 in the drawing). Each register R at the boundary between groups 1 and 2, between groups 2 and 3, and between groups 3 and 4 belongs to respective groups 1, 2 and 3 of the smaller group number. Register R at the boundary between sub-groups 1 and 2 belongs to sub-group 1. The same applies in the following.

Transfer gates 70.1–70.6 are interposed upstream in each of six data buses DB1–DB6. Test signal TE is applied to the control gate of transfer gates 70.1–70.6 via inverter 71. In response to test signal TE attaining an active state of an H level, transfer gates 70.1–70.6 are rendered nonconductive, whereby passage of read out data D1–D6 is inhibited. In response to test signal TE attaining an inactive state of an L level, transfer gates 70.1–70.6 are rendered conductive, whereby passage of read out data D1–D6 is permitted.

Four switches 72.1–72.4 are provided corresponding to the four groups. Four switches 73.1–73.4 are provided corresponding to the first sub-group of each of the four groups. Four switches 74.1–74.4 are provided corresponding to the second sub-group of each of the four groups. Switches 72.1–72.4 are provided downstream in data buses DB1–DB4, respectively. Switches 73.1–73.4 are sequentially arranged at data bus DB5 between transfer gate 70.5 and data output circuit 10. Switches 74.1–74.4 are sequentially arranged in data bus DB6 between transfer gate 70.6 and data output circuit 10.

Figure 20:
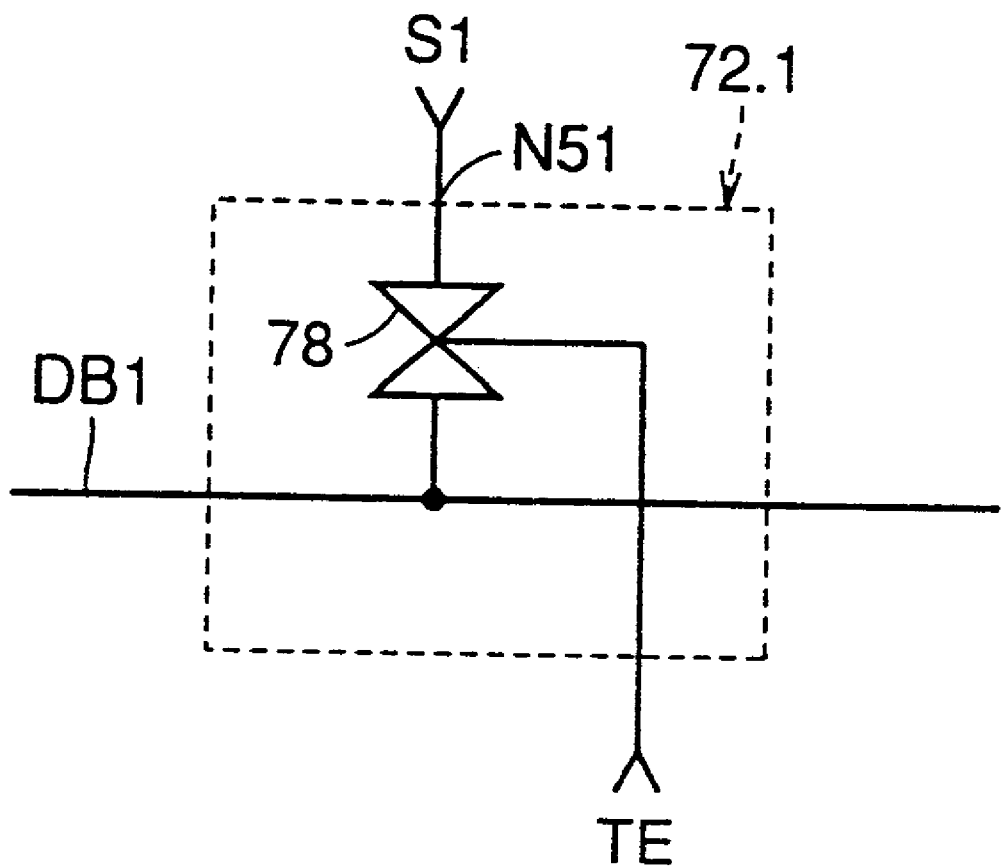
FIG. 20 is a circuit diagram showing a structure of a switch of FIG. 19.

As shown in FIG. 20, switch 72.1 includes a transfer gate 78 connected between a control signal input node N51 and a corresponding data bus DB1. Test signal TE is applied to the control node of transfer gate 78. Output signal S1 of register R of a predetermined stage (the final stage in the drawing) of a corresponding first group is input to control signal input node N51. When test signal TE attains an active state of an H level, transfer gate 78 is rendered conductive, whereby a corresponding control signal S1 is output to corresponding data bus DB1. When test signal TE attains an inactive state of an L level, transfer gate 78 is rendered nonconductive, whereby control signal S1 is blocked. Each of the other switches 72.2–72.4, 73.1–73.4, and 74.1–74.4 has a similar structure.

Four EX-OR gates 75.1–75.4 are provided corresponding to the four groups. Four transfer gates 76.1–76.4 are provided corresponding to the first sub-group of the four groups. Four transfer gates 77.1–77.4 are provided corresponding to the second sub-group. The one conduction electrodes of transfer gates 76.1–76.4 receive output signals S1a–S4a of register R of a predetermined stage in respective corresponding first sub-groups (in the drawing, register R of the second stage in the first sub-group of group 1, and registers R of the first stage in the first sub-groups of the other groups 2–4). The other conduction electrodes of each of transfer gates 76.1–76.4 are connected to control signal input node N51 of corresponding switches 73.1–73.4, respectively. Transfer gates 77.1–77.4 have one conduction electrodes receive output signals S1b–S4b of register R of a predetermined stage (first stage in the drawing) of respective corresponding second sub-groups, respectively, and have the other conduction electrodes connected to control signal input node N51 of corresponding switches 74.1–74.4, respectively.

EX-OR gate 75.1 receives the output signal of the first-stage register R and signal S1, and has its output connected to the control node of transfer gates 76.1 and 77.1. EX-OR gate 75.2 receives signals S1 and S2, and has its output connected to the control node of transfer gates 76.2 and 77.2. EX-OR gate 75.3 receives signals S2 and S3, and has its output connected to the control node of transfer gates 76.3 and 77.3. EX-OR gate 75.4 receives signals S3 and S4, and has its output connected to the control node of transfer gates 76.4 and 77.4.

An EX-OR gate of which the logics of the two input signals do not match (EX-OR gate 75.3 in the drawing) out of EX-OR gates 75.1–75.4 has its output driven to an H level. Transfer gates 76.3 and 77.3 corresponding to that EX-OR gate 75.3 are rendered conductive, whereby signals S3a and S3b are applied to control signal input node N51 of switches 73.3 and 74.3. In a test operation, signals S3a and S3b are applied to data output circuit 10 via switches 73.3 and 74.3 and data buses DB5 and DB6.

The operation of this SDRAM will be described briefly here. In a normal operation, test signal TE is at an inactive state of an L level. Transfer gates 70.1–70.6 conduct. Each transfer gate 78 of switches 72.1–72.4, 73.1–73.4, and 74.1–74.4 is rendered nonconductive, whereby shift transistor 23 is disconnected from data buses DB1–DB6. Read out data D1–D6 are applied to data output circuit 10 via data buses DB1–DB6.

In the test operation, test signal TE attains an active state of an H level. Transfer gates 70.1–70.6 are rendered nonconductive to inhibit passage of read out data D1–D6. Each transfer gate 78 of switches 72.1–72.4, 73.1–73.4 and 74.1–74.4 is rendered conductive, whereby shift transistor 23 is coupled with data buses DB1–DB6. Output signals S1–S4 of register R of a predetermined stage of the four groups are applied to data output circuit 10 via data buses DB1–DB4. Also, output signal S3a of register R of a predetermined stage in the first sub-group belonging to the group that includes a register R providing data 1 and a register R providing data 0, and output signal S3b of register R of a predetermined stage in the second sub-group are applied to data output circuit 10 via data buses DB5 and DB6.

In the present embodiment, identification can be made of which data 1 or 0 is output from a register R of a predetermined stage in each sub-group, in addition to identification of which of data 1 or 0 is output from a register R of a predetermined stage in each sub-group. Therefore, more detailed information of the status of shift register 23 can be obtained than that of the third to fifth embodiments.

In the present embodiment, only the output signal of one register R is output out of each sub-group. However, the output signals of all registers R belonging to each sub-group can be divided for output over a plurality of times in a time-divisional manner. Alternatively, a logic circuit such as an OR circuit, AND circuit, EX-OR circuit or the like can be provided for each sub-group and output the signal of the logic circuit outside.

Figure 21:
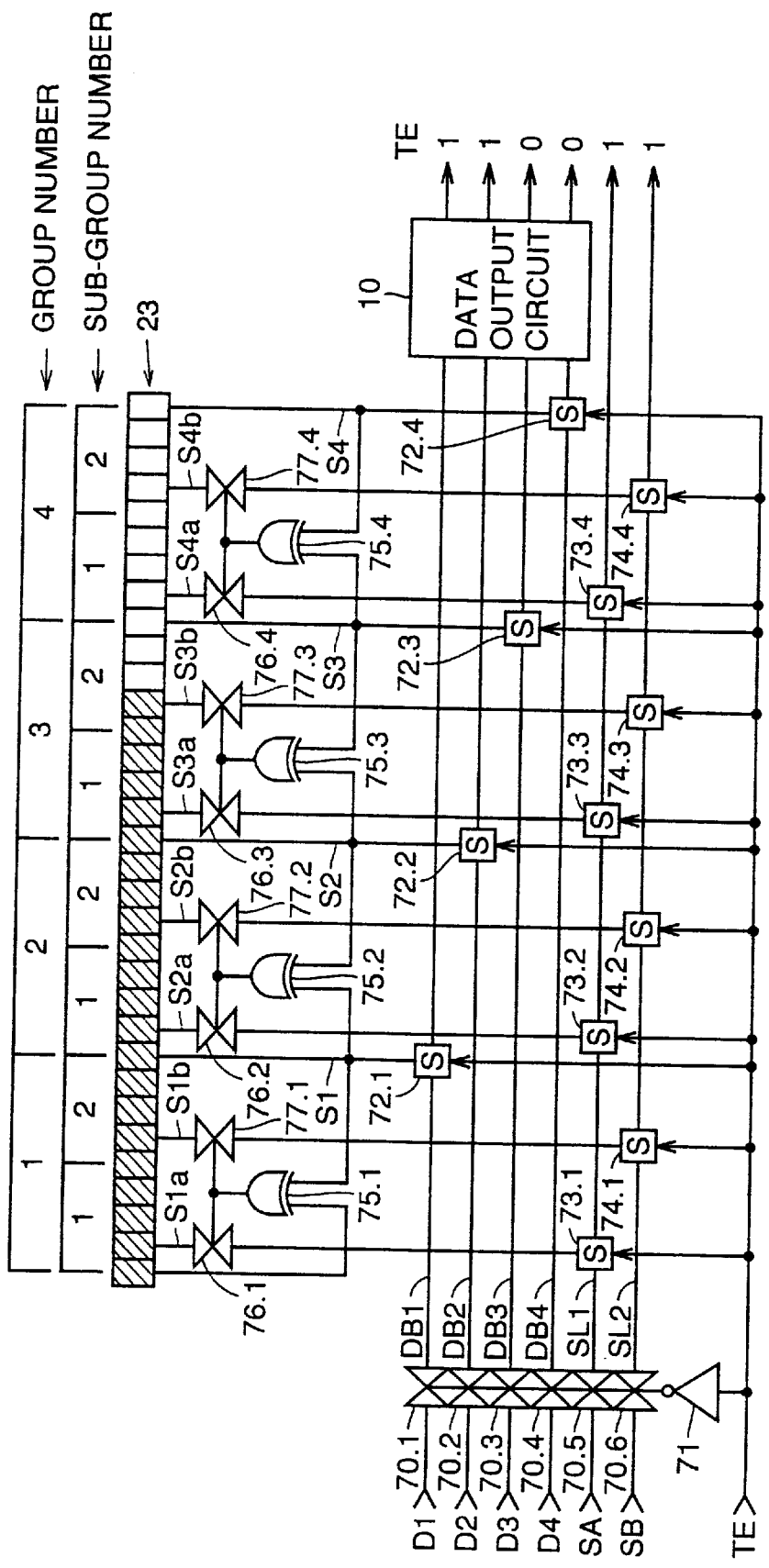
FIGS. 21, 22, 23 and 24 are circuit block diagrams showing modifications of the fifth embodiment of the present invention.

A modification of the fifth embodiment will be described hereinafter. Referring to the modification of FIG. 21, signal lines SL1 and SL2 are used other than the data bus for the output of signals S1a–S4a and S1b–S4b. A transfer gate 70.5 and switches 73.1–73.4 are provided at signal line SL1. A transfer gate 70.6 and switches 74.1–74.4 are provided at signal line SL2. Signal lines SL1 and SL2 are used for the output of internal signals SA and SB in a normal operation mode. In a test operation, signal lines SL1 and SL2 are used for the output of signals S1a–S4a and S1b–S4b. In this case, the number of data buses used for testing can be reduced.

Figure 22:
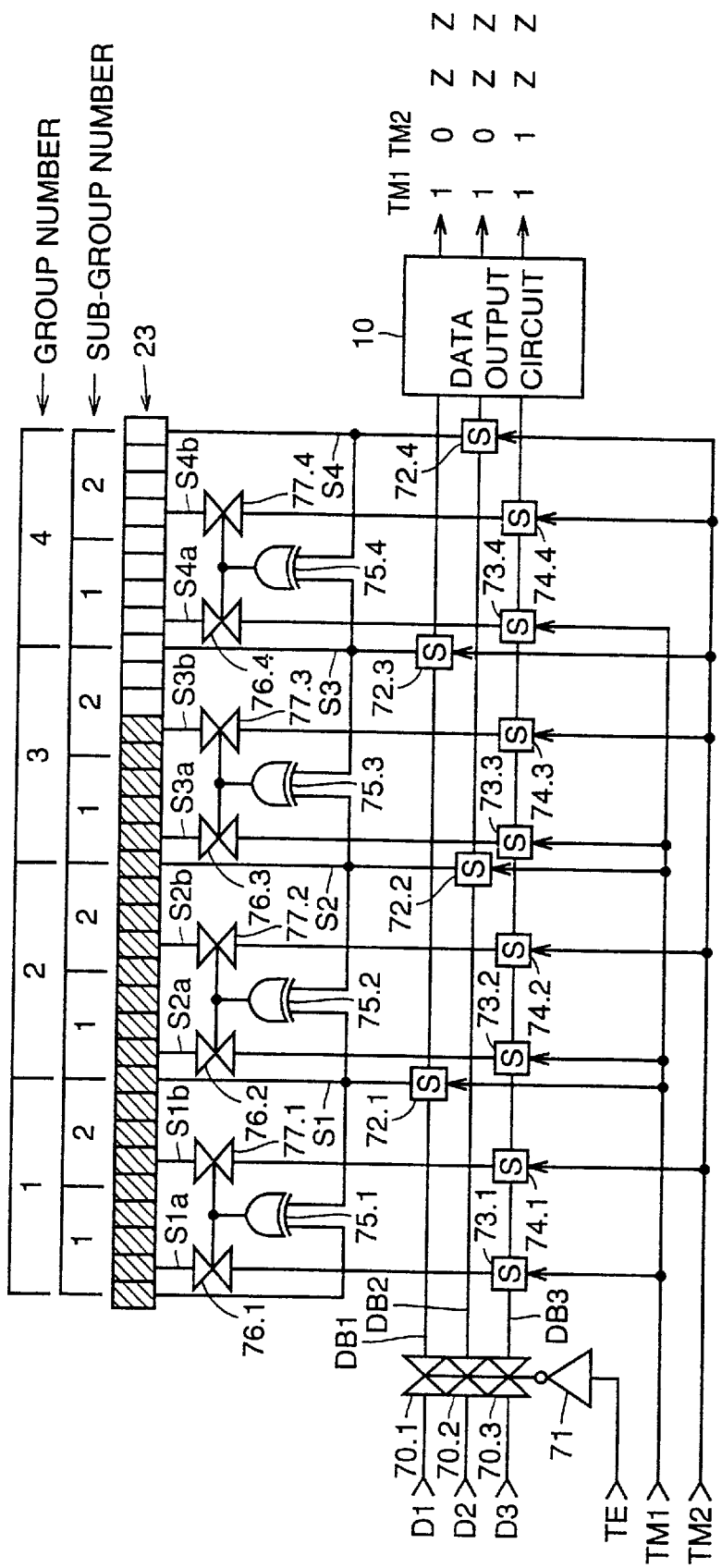

Referring to another modification shown in FIG. 22, the signals of 6 bits (for example, S1–S4, S3a and S3b) are output for every 3 bits in a time-divisional manner. More specifically, switches 73.1–73.4 and 74.1–74.4 are arranged at data bus DB3. Switches 72.3 and 72.4 are arranged at data buses DB1 and DB2, respectively. Switches 72.1, 72.2 and 73.1–73.4 are controlled by signal TM1. Switches 72.3, 72.4 and 74.1–74.4 are controlled by signal TM2. Signals TM1 and TM2 correspond to those to described with reference to FIG. 18. Therefore, signals S1, S2 and S3a are output during the period of signal TM1 at an H level. Signals S3, S4 and S3b are output during the period where signal TM2 is at an H level. In this case, the number of data buses and the number of input terminals of the monitor device used in the test operation can be halved.

Figure 23:
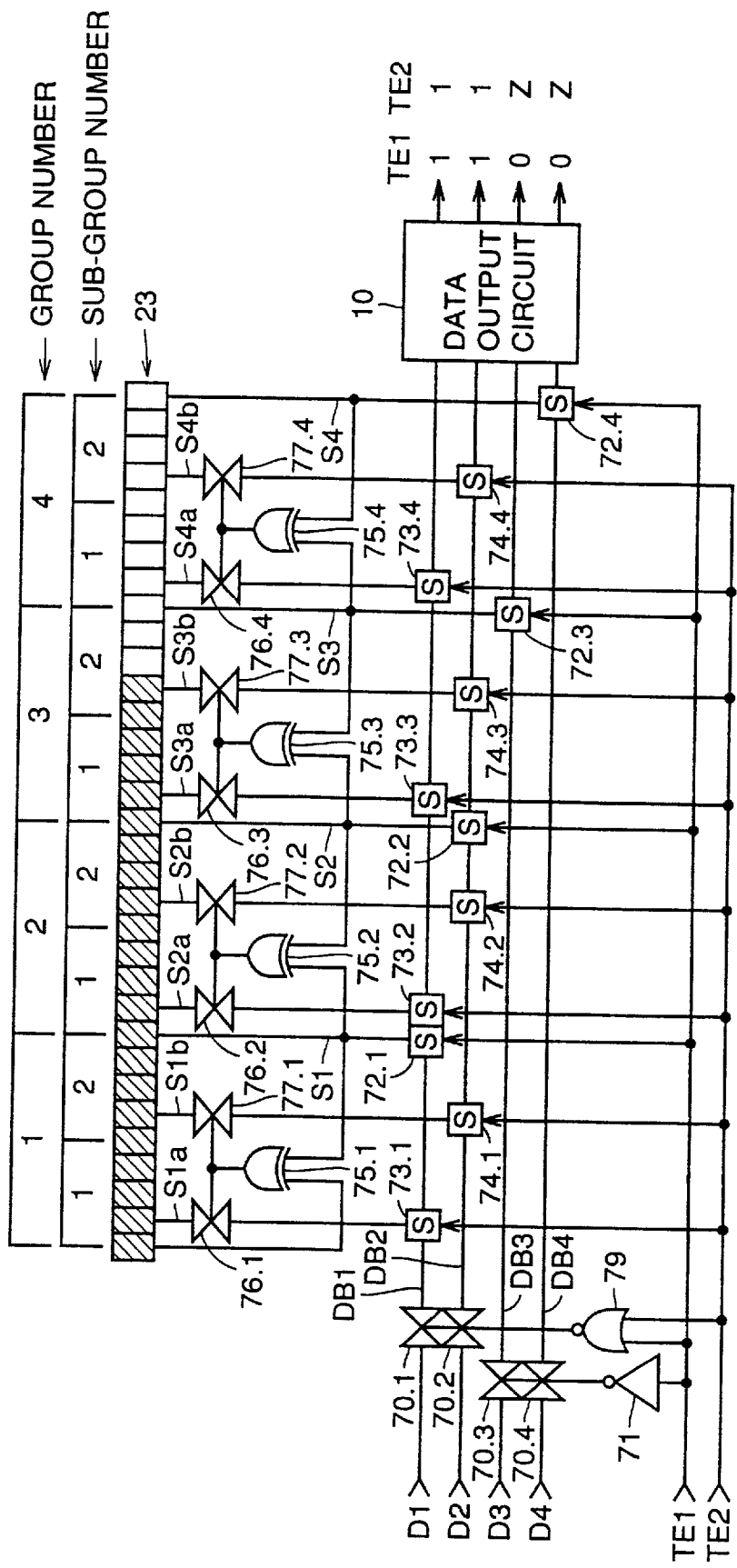

Referring to another modification shown in FIG. 23, the four bits of signals S1–S4 of the large group and the two bits of signals (for example, S3a, S3b) of the sub-group are output individually in respective first and second test modes. More specifically, switches 73.1–73.4 are arranged at data bus DB1. Switches 74.1–74.4 are arranged at data buses DB2. A NOR gate 79 is additionally provided. Test signal TE1 is applied to the control node of transfer gates 70.3 and 70.4 via inverter 71, to one input node of NOR gate 79, and also to the control node transfer gate 78 of switches 72.1–72.4. Test signal TE2 is applied to the other input node of NOR gate 79, and also to the control node of transfer gate 78 of switches 73.1–73.4 and 74.1–74.4. Test signal TE1 attains an active state of an H level in the first test mode. Test signal TE2 attains an active state of an H level in the second test mode.

In response to test signal TE1 attaining an H level, transfer gates 70.1–70.4 are rendered nonconductive, whereby passage of read out data D1–D4 is inhibited. Also, transfer gate 78 of switches 72.1–72.4 are rendered conductive, whereby signals S1–S4 are applied to data output circuit 10 via data buses DB1–DB4. In response to test signal TE2 attaining an H level, transfer gates 70.1 and 70.2 are rendered nonconductive, whereby passage of read out data D1 and D2 are inhibited. Also, transfer gate 78 of switches 73.1–73.4 and 74.1–74.4 are rendered conductive, whereby signals S3a and S3b are applied to data output circuit 10 via data buses DB1 and DB2. The modification provides the advantage of reducing the number of data buses and the number of input terminals of the monitor device used for testing in comparison to those of the circuit of FIG. 19.

Figure 24:
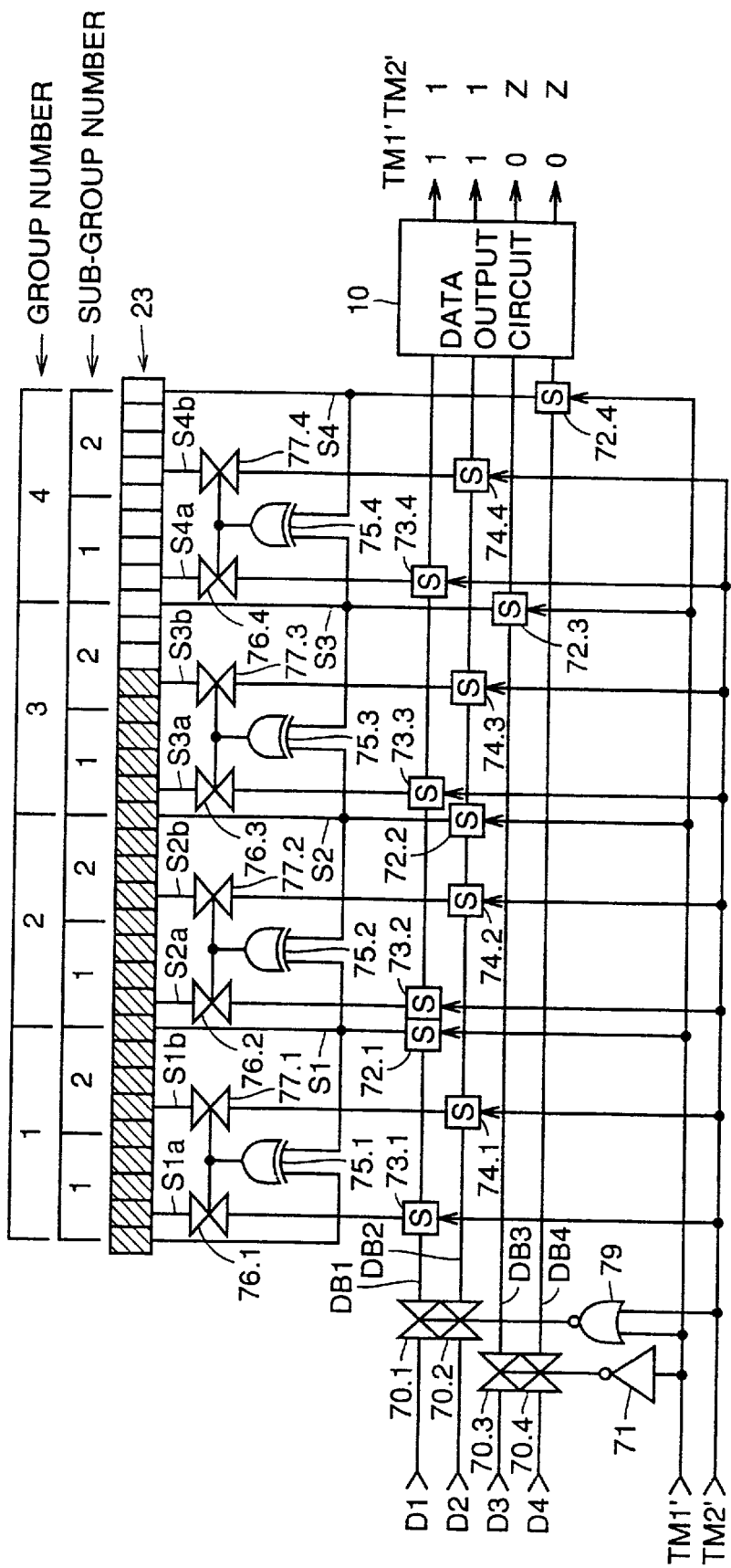
Figure 25:
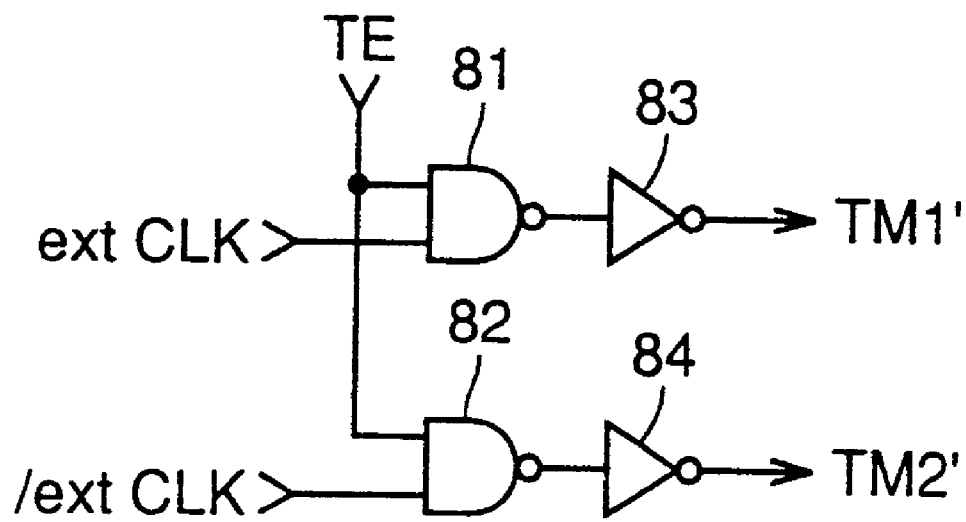
FIG. 25 is a circuit block diagram showing a structure of a signal generation circuit to generate signals TM1' and TM2' of FIG. 24.

Referring to another modification shown in FIG. 24, the four bits of signals S1–S4 of the large group and the 2 bits of signals (for example, S3a and S3b) of the sub-group are separately output in a time-divisional manner. More specifically, signals TM1' and TM2' are applied instead of test signals TE1 and TE2 of the modification shown in FIG. 23. FIG. 25 is a circuit diagram showing a structure of a signal generation circuit 80 to generate signals TM1' and TM2'. Referring to FIG. 25, signal generation circuit 80 includes NAND gates 81 and 82, and inverters 83 and 84. NAND gate 81 receives test signal TE and external clock signal extCLK. NAND gate 82 receives test signal TE and a signal/extCLK which is an inverted version of external clock signal extCLK. The outputs of NAND gates 81 and 82 are inverted by inverters 83 and 84, respectively, to become signals TM1' and TM2'. Test signal TE attains an active state of an H level when in a test mode.

During the period of test signal TE at an active state of an H level, clock signals extCLK and/extCLK directly become signals TM1' and TM2'. Therefore, signals TM1' and TM2' alternately attain an H level for every half cycle of clock signal extCLK. During the period of test signal TE at an inactive state of an L level, signals TM1 and TM2' are fixed at the L level. It is therefore not necessary to provide two types of test modes as in the modification of FIG. 23. By setting one test mode, two types of data are output alternately.

Figure 26:
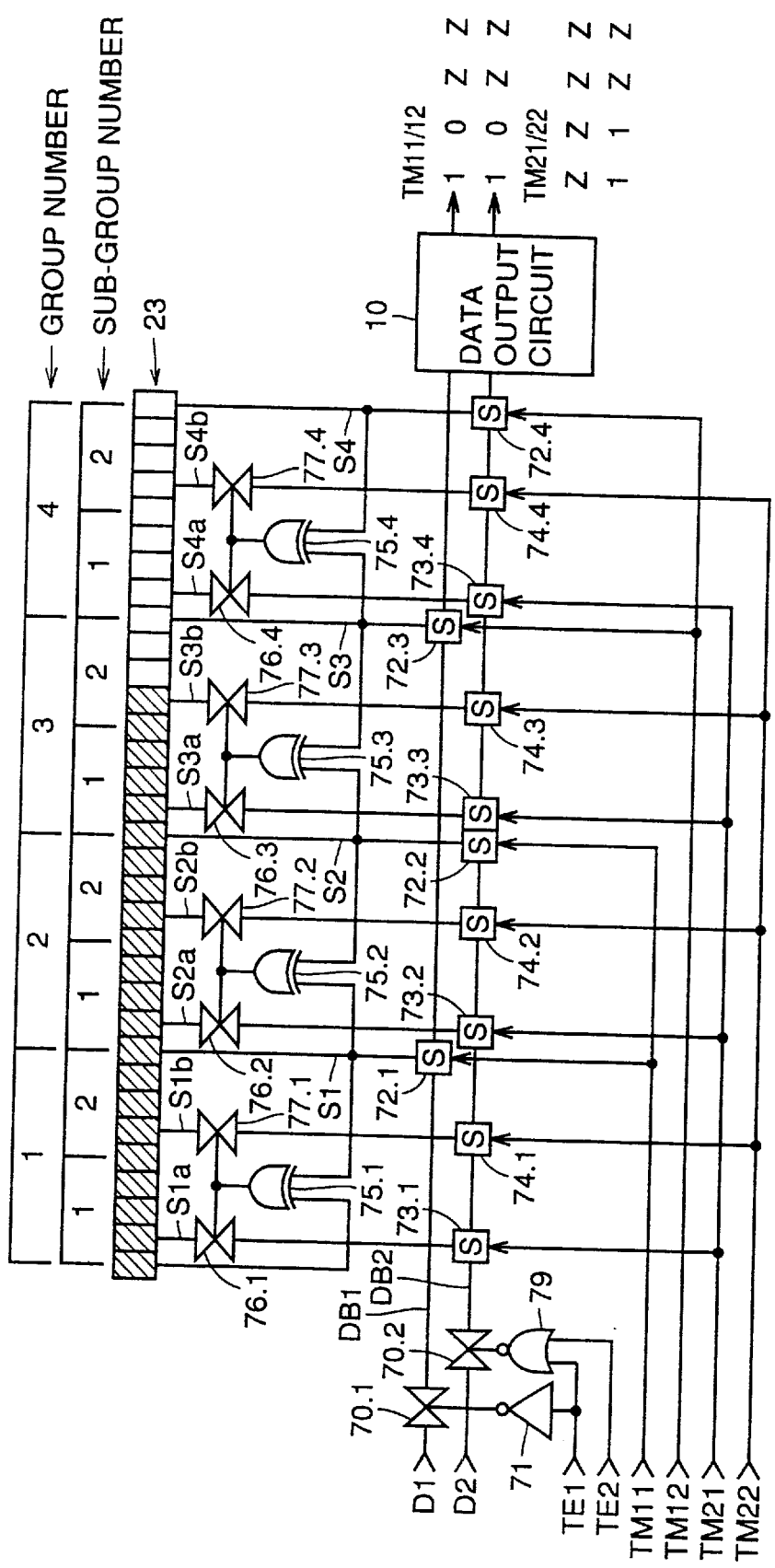
FIG. 26 is a circuit block diagram showing another modification of the fifth embodiment.

Referring to another modification of FIG. 26, four bits of signals S1–S4 are output 2 bits at a time in a time-divisional manner in the first test mode. In the second test mode, two bits of signals (for example, S3a and S3b) are output for every one bit in a time-divisional manner. More specifically, transfer gate 70.1 and switches 72.1 and 72.3 are arranged at data bus DB1. Transfer gate 70.2 and switches 73.1–73.4, 74.1–74.4 and 72.2 and 72.4 are arranged at data bus DB2. First test signal TE1 is applied to the control node of transfer gate 70.1 via inverter 71. NOR gate 79 receives first and second test signals TE1 and TE2, and has its output applied to the control node of transfer gate 70.2. First and second test signals TE1 and TE2 attain an active state of an H level when in the first test mode and second test mode, respectively. Switches 72.1 and 72.2 are controlled by signal TM11. Switches 72.3 and 72.4 are controlled by signal TM12. Switches 73.1–73.4 are controlled by signal TM21. Switches 74.1–74.4 are controlled by signal TM22.

Figure 27:
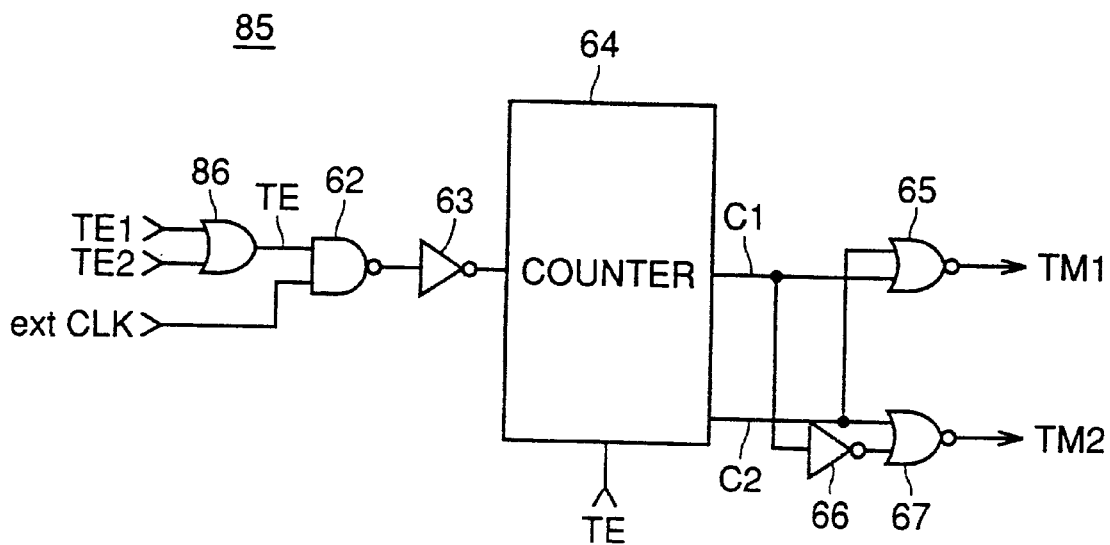
FIG. 27 is a circuit block diagram showing a portion of a signal generation circuit to generate signals TM11–TM22 of FIG. 22.
Figure 28:
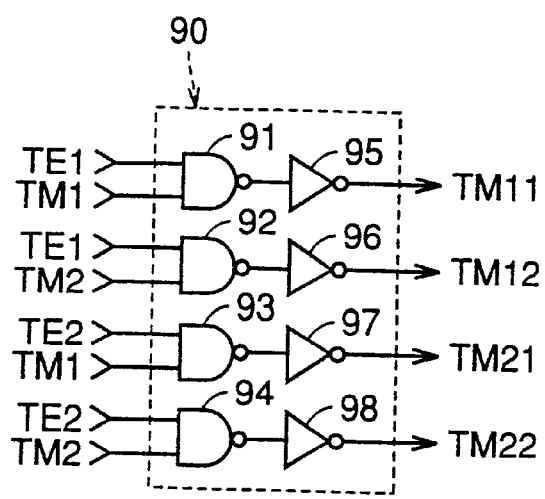
FIG. 28 is a circuit diagram showing another portion of the signal generation circuit to generate signals TM11–TM22 of FIG. 26.

FIGS. 27 and 28 are circuit diagrams showing a structure of signal generation circuits 85 and 90, respectively, to generate signals TM11–TM21. Referring to FIG. 27, signal generation circuit 85 includes an OR gate 86, in addition to signal generation circuit 61 of FIG. 18. OR gate 86 receives signals TE1 and TE2, and provides its output signal TE to NAND gate 62. In response to signal TE1 or TE2 attaining an active state of H level, counter 64 begins to count the number of pulses of external clock signal extCLK to output signals TM1 and TM2. Signals TM1 and TM2 attains an active state of an H level when count signals C1 and C2 of counter 64 becomes 0, 0; or 1, 0.

Referring to FIG. 28, signal generation circuit 90 includes NAND gates 91–94 and inverters 95–98. NAND gates 91–94 receive signals TE1 and TM1, TE1 and TM2, TE2 and TM1 and TE2 and TM2, respectively. Each output thereof is inverted by inverters 95–98 to become signals TM11, TM12, TM21 and TM22, respectively. During the period of test signal TE1 at an H level, signals TM1 and TM2 become signals TM11 and TM12. During the period of test signal TE2 at an H level, signals TM1 and TM2 become signals TM21 and TM22.

In the first test mode where test signal TE1 is at an H level, signals S1 and S2 and signals S3 and S4 are applied to data output circuit 10 via data buses DB1 and DB2 during the period of signals TM1 and TM2 at an H level. In the second test mode where test signal TE2 is at an H level, signals S3a and S3b are applied to data output circuit 10 via data bus DB2 when signals TM1 and TM2 are at an H level. In this modification, the number of data buses and the number of input terminals of the monitor device used for testing can be reduced.

Figure 29:
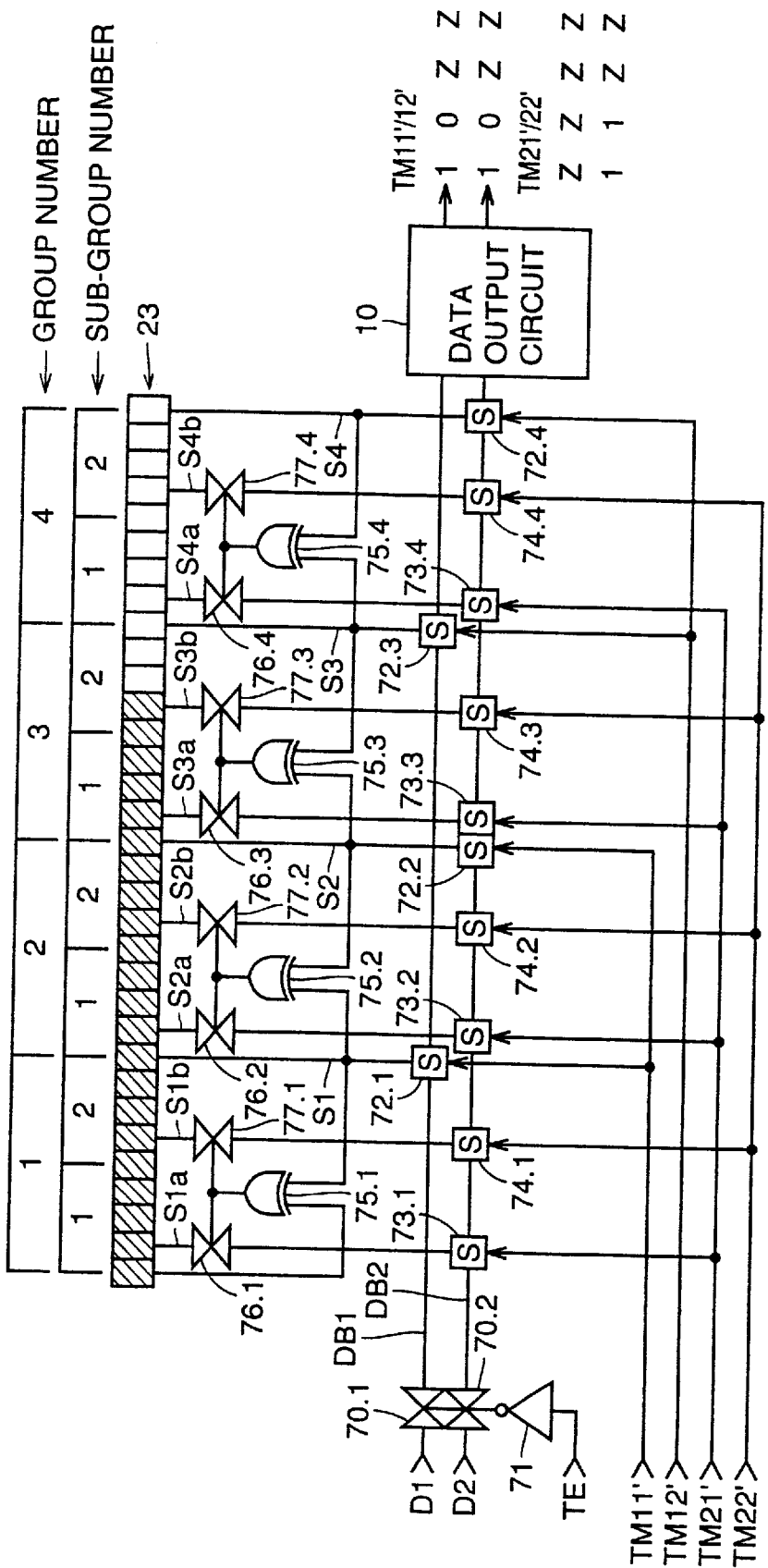
FIG. 29 is a circuit block diagram showing another modification of the fifth embodiment.

In the modification of FIG. 29, four bits of signals S1–S4 are output for every 2 bits in a time-divisional manner, and two bits of signals (for example, S3a and S3b) are output one bit at a time in a time-divisional manner in one test mode. More specifically, transfer gate 70.1 and switches 72.1 and 72.3 are arranged at data bus DB1. Transfer gate 70.2 and switches 73.1–73.4, 74.1–74.4, 72.2 and 72.4 are arranged at data bus DB2. Test signal TE is applied to the control node of transfer gates 70.1 and 70.2 via inverter 71. Test signal TE attains an active state of an H level in the test mode. Switches 72.1 and 72.2 are controlled by signal TM11'. Switches 72.3 and 72.4 are controlled by signal TM12'. Switches 73.1–73.4 are controlled by signal TM21'. Switches 74.1–74.4 are controlled by signals TM22'.

Figure 30:
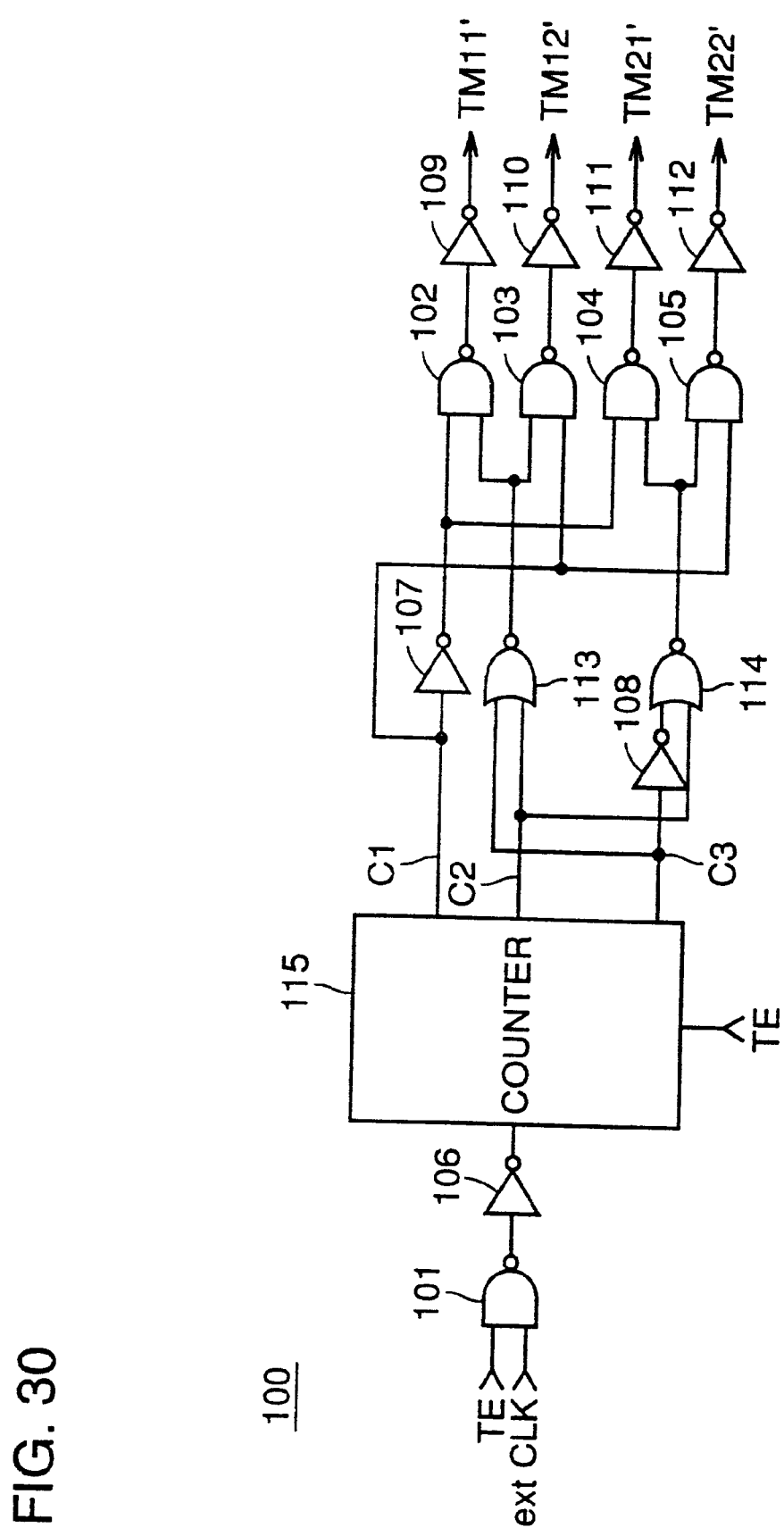
FIG. 30 is a circuit block diagram showing a structure of a signal generation circuit to generate signals TM11'–TM22' of FIG. 29.

FIG. 30 is a circuit block diagram showing a structure of a signal generation circuit 100 to generate signals TM11'–TM22'. Referring to FIG. 30, signal generation circuit 100 includes NAND circuits 101–105, inverters 106–112, NOR gates 113 and 114, and a counter 115. NAND gate 101 receives test signal TE and external clock signal extCLK to provide its output to a 3-bit counter 115 via inverter 106.

Counter 115 is rendered active when test signal TE is at an active state of an H level to count the number of pulses of the clock signals output from inverter 106 to provide 3 bits of count signals C1–C3. Counter 115 is rendered inactive when test signal TE is at an inactive state of an L level. Output signals C1, C2 and C3 thereof are fixed to 1, 1, 1.

Signal C1 is directly applied to one input nodes of NAND gates 103 and 105, and also applied to one input nodes of NAND gates 102 and 104 via inverter 107. Signal C2 is applied to one input nodes of NOR gates 113 and 114. Signal C3 is directly applied to the other input node of NOR gate 113, and also to the other input node of NOR gate 114 via inverter 108. The output of NOR gate 113 is applied to the other input nodes of NAND gates 102 and 103. The output of NOR gate 114 is applied to the other input nodes of NAND gates 104 and 105. The outputs of NAND gates 102–105 are inverted by inverters 109–112, respectively, to become signals TM11', TM12', TM21' and TM22', respectively.

FIGS. 31A–31D are timing charts representing the operation of signal generation circuit 100 of FIG. 30. In response to test signal TE attaining an active state of an H level, external clock signal extCLK is applied to counter 115 via NAND gate 101 and inverter 106. When count value CNT of counter 115 becomes 000, 001, 100 and 101, signals TM11', TM12', TM21' and TM22', are activated respectively. In response to signal TM11' attaining an active state of an H level, signals S1 and S2 are applied to data output circuit 10 via switches 72.1 and 72.2 and data buses DB1 and DB2.

In response to signal TM12' attaining an active state of an H level, signals S3 and S4 are applied to data output circuit 10 via switches 72.3 and 72.4 and data buses DB1 and DB2. In response to signal TM21' attaining an active state of an H level, signal S3a is applied to data output circuit 10 via switch 73.3 and data bus DB2. In response to signal TM22' attaining an active state of an H level, signal S3b is applied to data output circuit 10 via switch 74.3 and data bus DB2.

Therefore, it is not necessary to provide two types of test modes as in the modifications of FIGS. 26–28. By setting one test mode, signals of 6 bits can be sequentially output in a time-divisional manner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device operating in synchronization with an external clock signal, comprising:
    a variable delay circuit delaying said external clock signal to generate an internal clock signal, capable of controlling a delay time;
    a phase comparator comparing phases of said external clock signal and said internal clock signal to output a first control signal to reduce the delay time of said variable delay circuit when the phase of said internal clock signal is lagging behind the phase of said external clock signal, and to output a second control signal to increase the delay time of said variable delay circuit when the phase of said internal clock signal is leading the phase of said external clock signal;
    an up/down counter having a count value incremented in response to one of said first and second control signals being output, and decremented in response to the other of said first and second control signals being output;
    an internal circuit carrying out a predetermined operation in synchronization with said internal clock signal; and an output circuit providing a signal generated by said internal circuit outside in a normal operation, and providing the count value of said up/down counter outside when in a test operation.

2. The semiconductor device according to claim 1, wherein said up/down counter controls the delay time of said variable delay circuit according to its count value.

3. The semiconductor device according to claim 1, further comprising a shift register including a plurality of registers connected in series, each register holding and providing a signal of a first or second logic, and shifting the output logic to a succeeding stage in response to one of said first and second control signals being output and to a preceding stage in response to the other of said first and second control signals being output, said shift register controlling the delay time of said variable delay circuit by output signals of said plurality of registers.

4. The semiconductor device according to claim 3, wherein each of a plurality of registers of a first stage side out of the plurality of registers of said shift register holds said signal of the first logic, and each of the other registers holds said signal of the second logic.

5. The semiconductor device according to claim 3, wherein any one of the plurality of registers of said shift register holds said signal of the first logic, and each of the other registers holds said signal of the second logic.

6. The semiconductor device according to claim 1, wherein said internal circuit includes a memory circuit from which stored data is read out in synchronization with said internal clock signal,
wherein said output circuit comprises
a switch circuit receiving read out data of said memory circuit and the count value of said up/down counter to pass the read out data of said memory circuit in said normal operation and to pass the count value of said up/down counter in said test operation, and
a data output circuit providing the read out data of said memory circuit and the count value of said up/down counter passing said switch circuit outside.

7. A semiconductor device operating in synchronization with an external clock signal, comprising:
a variable delay circuit delaying said external clock signal to generate an internal clock signal, capable of controlling a delay time;
a phase comparator comparing phases of said external clock signal and said internal clock signal to output a first control signal to reduce the delay time of said variable delay circuit in response to the phase of said internal clock signal lagging behind the phase of said external clock signal and to output a second control signal to increase the delay time of said variable delay circuit in response to the phase of said internal clock signal leading ahead the phase of said external clock signal;
a shift register including a plurality of registers connected in series and divided in advance into a plurality of groups, each register holding and providing a signal of a first or second logic to shift the logic output to a succeeding stage in response to one of said first and second control signals being output and to a preceding stage in response to the other of said first and second control signals being output, said shift register controlling the delay time of said variable delay circuit according to output signals of said plurality of registers;
an internal circuit carrying out a predetermined operation in synchronization with said internal clock signal; and
an output circuit providing a signal generated by said internal circuit outside in a normal operation, and providing the output signal of at least one register out of each group outside in a test operation.

8. The semiconductor device according to claim 7, wherein said output circuit provides output signals of said plurality of registers divided for output over a plurality of times in a time-divisional manner in said test operation.

9. The semiconductor device according to claim 7, wherein any register of each group is preselected, and
wherein said output circuit provides an output signal of the preselected register of each group outside in said test operation.

10. The semiconductor device according to claim 9, wherein said output circuit provides output signals of preselected plurality of registers from said plurality of groups divided for output over a plurality of times in a time-divisional manner.

11. The semiconductor device according to claim 7, further comprising a first logic circuit provided corresponding to each group to generate an OR, AND, or exclusive-OR signal of output signals of a plurality of registers belonging to a corresponding group,
wherein said output circuit provides an output signal of each first logic circuit outside in said test operation.

12. The semiconductor device according to claim 11, wherein said output circuit provides output signals of a plurality of said first logic circuits divided for output over a plurality of times in a time-divisional manner.

13. The semiconductor device according to claim 7, wherein the plurality of registers of each group are further divided into a plurality of sub-groups,
further comprising a determination circuit determining whether the logic of the output signals of the plurality of registers of each group matches or not, and selecting an unmatching group,
wherein said output circuit further provides an output signal of at least one register in each sub-group belonging to the group selected by said determination circuit in said test operation.

14. The semiconductor device according to claim 13, wherein said test operation is divided into first and second tests,
wherein said output circuit provides an output signal of at least one register of each group outside in said first test, and provides an output signal of at least one register out of each sub-group belonging to the group selected by said determination circuit outside in said second test.

15. The semiconductor device according to claim 13, wherein said output circuit provides output signals of a plurality of registers of each sub-group belonging to the group selected by said determination circuit divided for output over a plurality of times in a time-divisional manner in said test operation.

16. The semiconductor device according to claim 13, wherein any register in each sub-group is preselected,
wherein said output circuit provides an output signal of the preselected register of each sub-group belonging to the group selected by said determination circuit outside in said test operation.

17. The semiconductor device according to claim 16, wherein said output circuit provides output signals of the preselected plurality of registers from said plurality of sub-groups divided for output over a plurality of times in a time-divisional manner.

18. The semiconductor device according to claim 7, wherein each of the plurality of registers of a first stage side out of the plurality of registers of said shift register holds said signal of the first logic, and each of the other registers holds said signal of the second logic.

19. The semiconductor device according to claim 7, wherein any one of the plurality of registers of said shift register holds said signal of the first logic, and each of the other registers holds said signal of the second logic.

20. The semiconductor device according to claim 7, wherein said internal circuit includes a memory circuit from which stored data is read out in synchronization with said internal clock signal, wherein said output circuit comprises a switch circuit receiving read out data of said memory circuit and an output signal of at least one register of each said group to pass read out data of said memory cell in said normal operation, and to pass the output signal of at least one register of said each group in said test operation, and a data output circuit providing read out data of said memory circuit and the output signal of at least one register of said each group passing said switch circuit outside.

* * * * *